(12) United States Patent
Dean et al.

(10) Patent No.: US 9,811,127 B2
(45) Date of Patent: Nov. 7, 2017

(54) TWIN SERVER BLADES FOR HIGH-DENSITY CLUSTERED COMPUTER SYSTEM

(71) Applicant: Silicon Graphics International Corp., Fremont, CA (US)

(72) Inventors: Steven J. Dean, Chippewa Falls, WI (US); Roger Ramseier, Chippewa Falls, WI (US); Mark Maloney, Chippewa Falls, WI (US); David R. Collins, Eau Claire, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 220 days.

(21) Appl. No.: 13/931,748

(22) Filed: Jun. 28, 2013

(65) Prior Publication Data

US 2014/0126142 A1    May 8, 2014

Related U.S. Application Data

(60) Provisional application No. 61/724,274, filed on Nov. 8, 2012.

(51) Int. Cl.
*H05K 5/00* (2006.01)
*H05K 7/00* (2006.01)
(Continued)

(52) U.S. Cl.
CPC ............. *G06F 1/20* (2013.01); *G06F 1/181* (2013.01); *H05K 7/20754* (2013.01); *H05K 7/20827* (2013.01); *G06F 2200/201* (2013.01)

(58) Field of Classification Search
CPC ....... H05K 7/1404; H05K 1/1409; G06F 1/20
(Continued)

(56) References Cited

U.S. PATENT DOCUMENTS 4,884,167 A    11/1989    Mine
4,884,168 A    11/1989    August et al.
(Continued)

FOREIGN PATENT DOCUMENTS

JP    2016-502714 A    1/2016
JP    2016/505917 A    2/2016
(Continued)

OTHER PUBLICATIONS

Woodacre, M. "Capability system with interconnect for global addressability and hardware collectives," 15th Workshop on High Performance Computing in Meterology, Session 10, Oct. 3, 2012, pp. 5-7(online), (retrieved on Feb. 17, 2014), http://www.ecmwf.int/newsevents/meetings/workshops/2012/high_performance_computing_15th/Presentations/.
(Continued)

*Primary Examiner* — Jerry Wu
(74) *Attorney, Agent, or Firm* — Sunstein Kann Murphy & Timbers LLP

(57) ABSTRACT

A high performance computing system with a plurality of computing blades has at least one computing blade that includes one or more computing boards and two side rails disposed at either side of the computing board. Each side rail has a board alignment element configured to hold the computing board within the computing blade, so that a top of the computing board is coupled to, and adjacent to, a portion of the board alignment element.

18 Claims, 25 Drawing Sheets

(51) Int. Cl.
  *G06F 1/20* (2006.01)
  *H05K 7/20* (2006.01)
  *G06F 1/18* (2006.01)

(58) Field of Classification Search
  USPC ........ 361/679.46–679.54, 688–747; 181/198
  See application file for complete search history.

(56) References Cited

U.S. PATENT DOCUMENTS

| | | | |
|---|---|---|---|
| 5,030,108 A | 7/1991 | Babow et al. | 439/64 |
| 5,483,420 A * | 1/1996 | Schiavini | 361/707 |
| 5,810,501 A | 9/1998 | Ross | |
| 5,892,658 A | 4/1999 | Urda et al. | 361/704 |
| 6,064,575 A | 5/2000 | Urda et al. | |
| 6,071,143 A | 6/2000 | Barthel et al. | 439/377 |
| 6,175,490 B1 | 1/2001 | Papa et al. | 361/686 |
| 6,255,588 B1 | 7/2001 | Shepherd | 174/72 B |
| 6,828,675 B2 | 12/2004 | Memory et al. | 257/714 |
| 6,934,152 B1 * | 8/2005 | Barrow | H05K 7/1461 165/80.3 |
| 7,142,411 B2 | 11/2006 | McLeod | 361/624 |
| 7,173,821 B2 | 2/2007 | Coglitore | 361/695 |
| 7,318,322 B2 | 1/2008 | Ota et al. | |
| 7,342,789 B2 | 3/2008 | Hall et al. | 361/701 |
| 7,394,667 B2 | 7/2008 | Kelly et al. | 361/823 |
| 7,564,685 B2 | 7/2009 | Clidaras et al. | |
| 7,589,974 B2 | 9/2009 | Grady et al. | |
| 7,639,499 B1 | 12/2009 | Campbell et al. | 361/699 |
| 7,907,406 B1 * | 3/2011 | Campbell et al. | 361/699 |
| 8,027,162 B2 | 9/2011 | Campbell et al. | |
| 8,351,192 B2 | 1/2013 | Archibald et al. | 361/679.02 |
| 9,128,682 B2 | 9/2015 | Dean et al. | 361/601 |
| 9,229,497 B2 | 1/2016 | Dean et al. | |
| 2002/0124114 A1 | 9/2002 | Bottom et al. | |
| 2005/0071689 A1 | 3/2005 | Coward et al. | 713/300 |
| 2005/0117316 A1* | 6/2005 | Wrycraft | 361/802 |
| 2007/0002536 A1 | 1/2007 | Hall et al. | 361/695 |
| 2008/0080149 A1 | 4/2008 | Hanna et al. | 361/752 |
| 2008/0094797 A1* | 4/2008 | Coglitore et al. | 361/687 |
| 2008/0158818 A1* | 7/2008 | Clidaras et al. | 361/699 |
| 2009/0086432 A1 | 4/2009 | Campbell et al. | 361/696 |
| 2010/0254089 A1 | 10/2010 | Anderl et al. | |
| 2011/0007473 A1 | 1/2011 | Franz et al. | 361/679.33 |
| 2011/0013348 A1 | 1/2011 | Seibold et al. | |
| 2011/0255230 A1 | 10/2011 | Mori | |
| 2012/0120603 A1 | 5/2012 | Campbell et al. | 361/698 |
| 2012/0140403 A1 | 6/2012 | Lau et al. | 361/679.47 |
| 2012/0147553 A1 | 6/2012 | Eriksen | |
| 2012/0293947 A1 | 11/2012 | Chen et al. | |
| 2012/0327591 A1 | 12/2012 | Jau et al. | 361/679.48 |
| 2014/0124168 A1 | 5/2014 | Dean et al. | 165/67 |

FOREIGN PATENT DOCUMENTS

| | | |
|---|---|---|
| TW | M413895 | 10/2011 |
| WO | WO 2008/070175 A2 | 6/2008 |
| WO | 2012118554 A1 | 9/2012 |
| WO | WO 2012/118554 A1 | 9/2012 |
| WO | WO 2014/074232 A1 | 5/2014 |
| WO | WO 2014/074233 A1 | 5/2014 |
| WO | WO 2014/074235 A1 | 5/2014 |
| WO | WO 2014/074236 A1 | 5/2014 |

OTHER PUBLICATIONS

International Searching Authority—International Search Report—International Application No. PCT/US2013/061392 dated Mar. 6, 2014, together with the Written Opinion of the International Searching Authority, 20 pages.

European Patent Office European Search Report — Application No. 13853840.0/1959, dated Sep. 20, 2016, 6 pages.

European Patent Office European Search Opinion — Application No. 13853840.0-1959, dated Sep. 20, 2016, 6 pages.

European Patent Office Supplementary Partial European Search Report — Application No. 13853840.0-1959, dated Sep. 20, 2016, 6 pages.

\* cited by examiner

TWIN SERVER BLADES FOR HIGH-DENSITY CLUSTERED COMPUTER SYSTEM

CROSS REFERENCE TO RELATED APPLICATIONS

The present application claims priority to U.S. Provisional Patent Application No. 61/724,274 filed Nov. 8, 2012, the disclosure of which is incorporated by reference herein in its entirety.

The present application is related to U.S. patent application No. 13/931,730 entitled ON-BLADE COLD SINK FOR HIGH-DENSITY CLUSTERED COMPUTER SYSTEM, filed on Jun. 28, 2013, now U.S. Pat. No. 9,229,497, and U.S. Patent Application No. 13/931,754 entitled CLOSED-LOOP COOLING SYSTEM FOR HIGH-DENSITY CLUSTERED COMPUTER SYSTEM, filed on Jun. 28, 2013, the disclosures of which are incorporated by reference herein in their entirety.

TECHNICAL FIELD

The invention generally relates to a blade configuration in a multi-node computer system and, more particularly, the invention relates to a twin blade configuration for a high-density clustered computer system.

BACKGROUND ART

As high performance computing ("HPC") systems have gotten more powerful, physical constraints and density requirements are driving many aspects of the high-density clustered computer configuration. Effective supercomputing architectures must simultaneously enable the latest technologies while providing maximum flexibility in terms of interconnect, power, and cooling. Standard blade and cooling configurations, however, are unable to adequately handle the scale and density requirements currently demanded for high-density clusters. Thus, new compute blade designs are needed to accommodate the physical and performance density requirements in demanding high-density clustered computer installations.

SUMMARY OF VARIOUS EMBODIMENTS

Various embodiments of the present invention provide a unique physical packaging and mounting solution for a computing blade used in a high performance computing ("HPC") system. In one embodiment of the present invention, at least one computing blade includes one or more computing boards and two side rails disposed at either side of the computing board. Each side rail has a board alignment element configured to hold the computing board within the computing blade, so that a top of the computing board is coupled to, and adjacent to, a portion of the board alignment element.

In related embodiments, the board alignment element may be substantially c-shaped with upper and lower board attachment portions substantially perpendicular to the side rails, and the computing board may be adjacent to an outer side of the upper or lower board attachment portions. The computing blade may include two computing boards configured as two separate computing nodes, and a top of each board may be coupled to, and adjacent to, a corresponding board attachment portion of the board alignment element. The two computing boards may be disposed on top of one another such that the top of one computing board faces the top of the other computing board. Each computing board may have a base compute section, and a layout of components in the base compute section may be substantially the same in the two computing boards. Each computing board may have a base compute section, and some components in the base compute section on one computing board may be interleaved between corresponding components in the base compute section on the other computing board. The computing blade may further include one or more air-cooled heat sinks with each heat sink disposed between the two computing boards.

In other related embodiments, the HPC system may further include one or more blade enclosures configured to hold the plurality of computing blades, and the blade enclosure may have at least two side mounts configured to hold the side rails. The computing blade may include two computing boards and the blade enclosure may include a fluid cooling manifold. The system may further include one or more cooling plates, with each cooling plate disposed between the two computing boards, and a fluid connection coupled to the cooling plate and in fluid communication with the fluid cooling manifold. The cooling manifold may be along a back of the blade enclosure or along a side of the blade enclosure and configured to connect to each cooling plate between the two computing boards. The two cooling plates may be disposed between the two computing boards in a side-by-side configuration, with one plate between the two computing boards in one region of the computing blade and the other plate between the two computing boards in another region of the computing blade. Alternatively, four cooling plates may be disposed between the two computing boards, with two plates between the two computing boards in one region of the computing blade and the other two plates between the two computing boards in another region of the computing blade. The cooling manifold may include a supply line and a return line.

In other related embodiments, the system may further include an external cooling distribution unit having fluid connections in fluid communication with the cooling manifold. The external cooling distribution unit may further include a liquid-cooled heat exchanger in contact with a portion of the fluid connections and one or more pumps configured to move liquid within the fluid connections from the cooling manifolds to the liquid-cooled heat exchanger. The blade enclosures may be configured in two compute racks, and the system may further includes a cooling tower adjacent to a side of the first compute rack and a side of the second compute rack. The cooling tower may have at least one water-cooled heat exchanger, and one or more blowers configured to draw warm air from the side towards a back of the first and second compute racks across the water-cooled heat exchanger, and to circulate cooled air to the side towards a front of the first and second compute racks. The compute racks and cooling tower may be enclosed within a housing to provide a closed-loop air flow within the housing. The board alignment element may further include a mounting section that extends beyond the board attachment portion, and the mounting section may be configured to engage with and couple the board alignment element to the side rail.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Embodiments of the present invention provide a compact physical packaging configuration for a compute blade that uses side rails, instead of pans or carriers, and that mounts off the top side of the computing boards. This approach provides better positional control of blind mating connectors to the backplane and greater flexibility for the designer to consider a wider range of printed circuit board (PCB) thicknesses (and thus and layer counts). This allows the designer to evaluate the trade-offs between a thicker board versus greater back side component height. None of these considerations, however, changes the basic location of the critical connectors on the top side of the board. With the elimination of pans or carriers, side rails minimize the weight and material used in the blade, and thus reduce the weight of the overall HPC system. In addition, the side rails provide lead-in features, alignment features, and incorporate the mounting provisions for the boards, which interface with the top of the boards instead of the bottom of the boards as is typically done.

Top side mounting also enables better control of board to board spacing, enables better blade to chassis alignment of all boards in the blade, and enables a wider range of board thicknesses to be supported without altering board to board spacing or board to chassis alignment. In addition, the side rails act as standoffs to protect the PCBs and are significantly lighter and lower cost than pans or trays. Embodiments of the blade configuration allow for a simpler design by leveraging one design across both node boards and also allow for the interleaving of components for a more compact configuration and space savings.

Embodiments of the HPC system may further include an on-blade cooling system that provides a greater cooling capacity (e.g., for processors that exceed 600 watts) than rack-level cooling which utilizes fans and air-cooled heat sinks. Additional cooling may be provided to the blades in the system with a cooling distribution unit that is external to the blade enclosure that holds the blades. In addition, the blades may be further air cooled using a closed-loop air flow arrangement with a cooling tower. Details of illustrative embodiments are discussed below.

System Architecture

Figure 1:
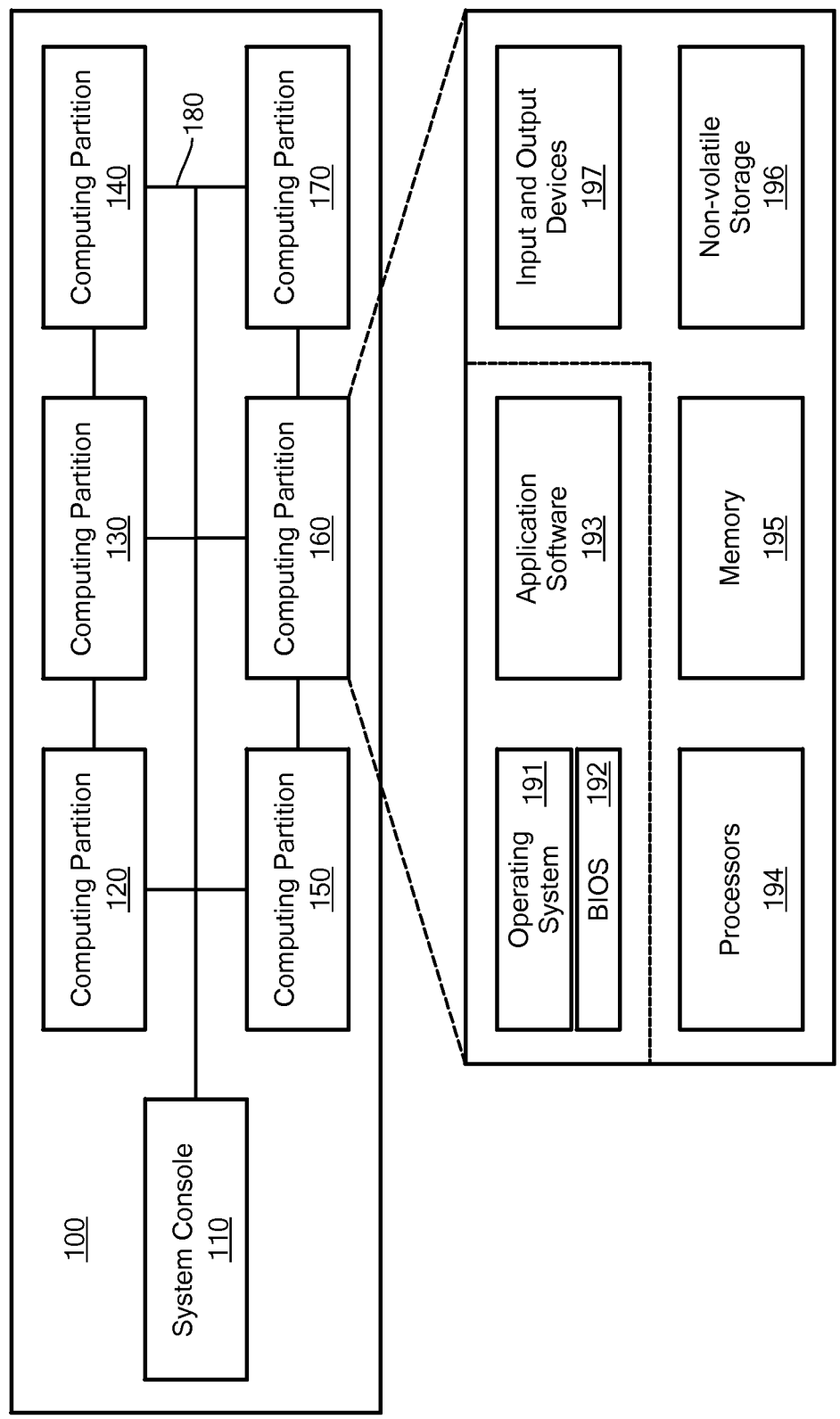
FIG. 1 schematically shows a logical view of an exemplary HPC system used with embodiments of the present invention.

FIG. 1 schematically shows a logical view of an exemplary high-performance computing system 100 that may be used with illustrative embodiments of the present invention. Specifically, as known by those in the art, a "high-performance computing system," or "HPC system," is a computing system having a plurality of modular computing resources that are tightly coupled using hardware interconnects, so that processors may access remote data directly using a common memory address space.

The HPC system 100 includes a number of logical computing partitions 120, 130, 140, 150, 160, 170 for providing computational resources, and a system console 110 for managing the plurality of partitions 120-170. A "computing partition" (or "partition") in an HPC system is an administrative allocation of computational resources that runs a single operating system instance and has a common memory address space. Partitions 120-170 may communicate with the system console 110 using a logical communication network 180. A system user, such as a scientist, engineer, or technician, who desires to perform a calculation, may request computational resources from a system operator, who uses the system console 110 to allocate and manage those resources. Allocation of computational resources to partitions is described below. The HPC system 100 may have any number of computing partitions that are administratively assigned as described in more detail below, and often has only one partition that encompasses all of the available computing resources. Accordingly, this figure should not be seen as limiting the scope of embodiments of the present invention.

Each computing partition, such as partition 160, may be viewed logically as if it were a single computing device, akin to a desktop computer. Thus, the partition 160 may execute software, including a single operating system ("OS") instance 191 that uses a basic input/output system ("BIOS") 192 as these are used together in the art, and application software 193 for one or more system users.

Accordingly, as also shown in FIG. 1, a computing partition may have various hardware allocated to it by a system operator, including one or more processors 194, volatile memory 195, non-volatile storage 196, and input and output ("I/O") devices 197 (e.g., network cards, video display devices, keyboards, and the like). However, in HPC systems like the embodiment in FIG. 1, each computing partition has a great deal more processing power and memory than a typical desktop computer. The OS software may include, for example, a Windows® operating system by Microsoft Corporation of Redmond, Wash., or a Linux operating system. Moreover, although the BIOS may be provided as firmware by a hardware manufacturer, such as Intel Corporation of Santa Clara, Calif., it is typically customized according to the needs of the HPC system designer to support high-performance computing, as described below in more detail.

As part of its system management role, the system console 110 acts as an interface between the computing capabilities of the computing partitions 120-170 and the system operator or other computing systems. To that end, the system console 110 issues commands to the HPC system hardware and software on behalf of the system operator that permit, among other things: 1) booting the hardware, 2) dividing the system computing resources into computing partitions, 3) initializing the partitions, 4) monitoring the health of each partition and any hardware or software errors generated therein, 5) distributing operating systems and application software to the various partitions, 6) causing the operating systems and software to execute, 7) backing up the state of the partition or software therein, 8) shutting down application software, and 9) shutting down a computing partition or the entire HPC system 100. These particular functions are described in more detail in the section below entitled "System Operation."

Figure 2:
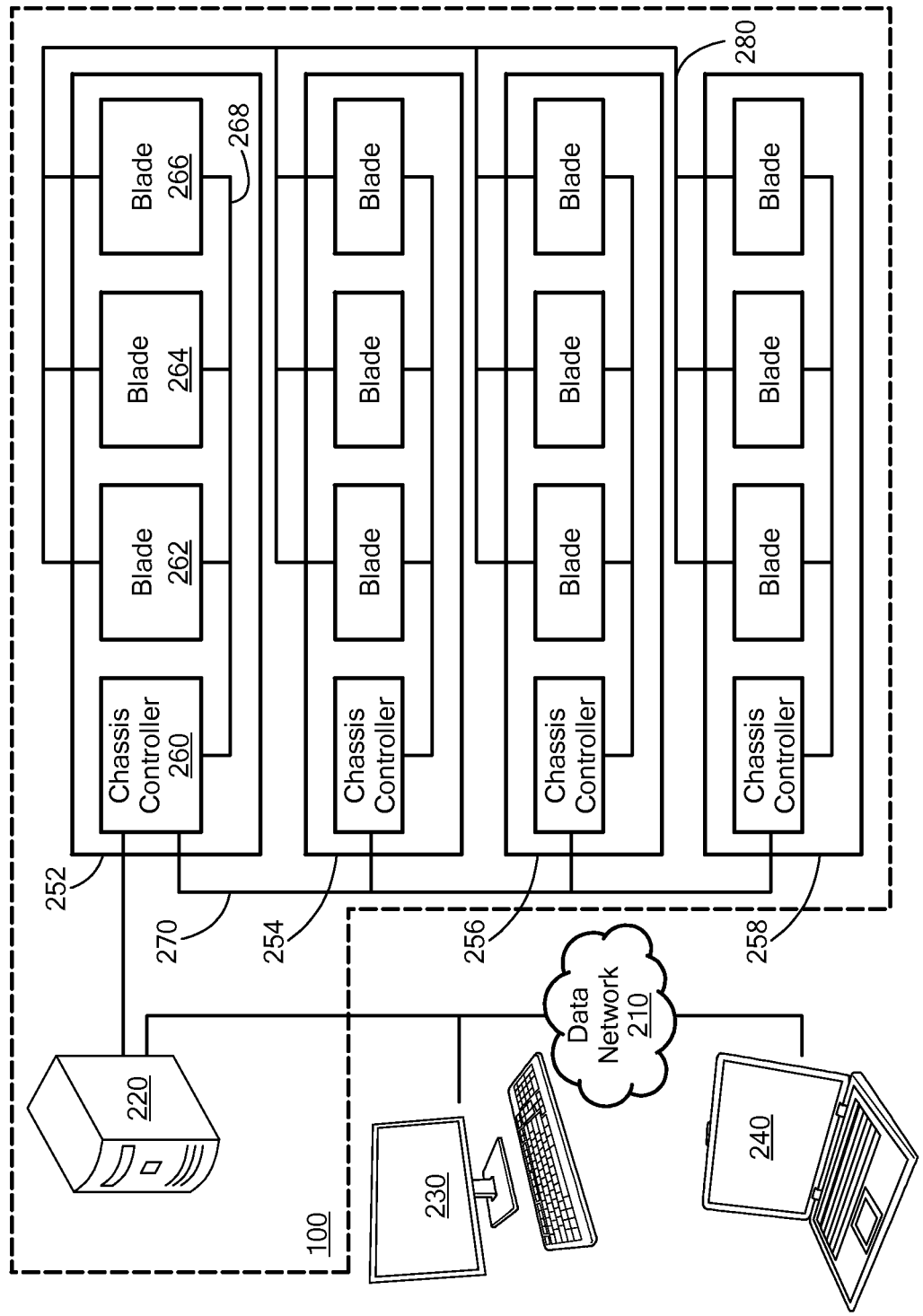
FIG. 2 schematically shows a physical view of the HPC system of FIG. 1.

FIG. 2 schematically shows a physical view of a high performance computing system 100 in accordance with the embodiment of FIG. 1. The hardware that comprises the HPC system 100 of FIG. 1 is surrounded by the dashed line. The HPC system 100 is connected to an enterprise data network 210 to facilitate user access.

The HPC system 100 includes a system management node ("SMN") 220 that performs the functions of the system console 110. The management node 220 may be implemented as a desktop computer, a server computer, or other similar computing device, provided either by the enterprise or the HPC system designer, and includes software necessary to control the HPC system 100 (i.e., the system console software).

The HPC system 100 is accessible using the data network 210, which may include any data network known in the art, such as an enterprise local area network ("LAN"), a virtual private network ("VPN"), the Internet, or the like, or a combination of these networks. Any of these networks may permit a number of users to access the HPC system resources remotely and/or simultaneously. For example, the management node 220 may be accessed by an enterprise computer 230 by way of remote login using tools known in the art such as Windows® Remote Desktop Services or the Unix secure shell. If the enterprise is so inclined, access to the HPC system 100 may be provided to a remote computer 240. The remote computer 240 may access the HPC system by way of a login to the management node 220 as just described, or using a gateway or proxy system as is known to persons in the art.

The hardware computing resources of the HPC system 100 (e.g., the processors, memory, non-volatile storage, and I/O devices shown in FIG. 1) are provided collectively by one or more "blade chassis," such as blade chassis 252, 254, 256, 258 shown in FIG. 2, that are managed and allocated into computing partitions. A blade chassis is an electronic chassis that is configured to house, power, and provide high-speed data communications between a plurality of stackable, modular electronic circuit boards called "blades." Each blade includes enough computing hardware to act as a standalone computing server. The modular design of a blade chassis permits the blades to be connected to power and data lines with a minimum of cabling and vertical space.

Accordingly, each blade chassis, for example blade chassis 252, has a chassis management controller 260 (also referred to as a "chassis controller" or "CMC") for managing system functions in the blade chassis 252, and a number of blades 262, 264, 266 for providing computing resources. Each blade, for example blade 262, contributes its hardware computing resources to the collective total resources of the HPC system 100. The system management node 220 manages the hardware computing resources of the entire HPC system 100 using the chassis controllers, such as chassis controller 260, while each chassis controller in turn manages the resources for just the blades in its blade chassis. The chassis controller 260 is physically and electrically coupled to the blades 262-266 inside the blade chassis 252 by means of a local management bus 268, described below in more detail. The hardware in the other blade chassis 254-258 is similarly configured.

The chassis controllers communicate with each other using a management connection 270. The management connection 270 may be a high-speed LAN, for example, running an Ethernet communication protocol, or other data bus. By contrast, the blades communicate with each other using a computing connection 280. To that end, the computing connection 280 illustratively has a high-bandwidth, low-latency system interconnect, such as NumaLink, developed by Silicon Graphics International Corp. of Fremont, Calif.

The chassis controller 260 provides system hardware management functions to the rest of the HPC system. For example, the chassis controller 260 may receive a system boot command from the SMN 220, and respond by issuing boot commands to each of the blades 262-266 using the local management bus 268. Similarly, the chassis controller 260 may receive hardware error data from one or more of the blades 262-266 and store this information for later analysis in combination with error data stored by the other chassis controllers. In some embodiments, such as that shown in FIG. 2, the SMN 220 or an enterprise computer 230 are provided access to a single, master chassis controller 260 that processes system management commands to control the HPC system 100 and forwards these commands to the other chassis controllers. In other embodiments, however, an SMN 220 is coupled directly to the management connection 270 and issues commands to each chassis controller individually. Persons having ordinary skill in the art may contemplate variations of these designs that permit the same type of functionality, but for clarity only these designs are presented herein.

The blade chassis 252, its blades 262-266, and the local management bus 268 may be provided as known in the art. However, the chassis controller 260 may be implemented using hardware, firmware, or software provided by the HPC system designer. Each blade provides the HPC system 100 with some quantity of processors, volatile memory, non-volatile storage, and I/O devices that are known in the art of standalone computer servers. However, each blade also has hardware, firmware, and/or software to allow these computing resources to be grouped together and treated collectively as computing partitions, as described below in more detail in the section entitled "System Operation."

While FIG. 2 shows an HPC system 100 having four chassis and three blades in each chassis, it should be appreciated that any combination of chassis and blades may be used and these figures do not limit the scope of embodiments of the present invention. For example, an HPC system may have dozens of chassis and hundreds of blades; indeed, HPC systems often are desired because they provide very large quantities of tightly-coupled computing resources.

Figure 3:
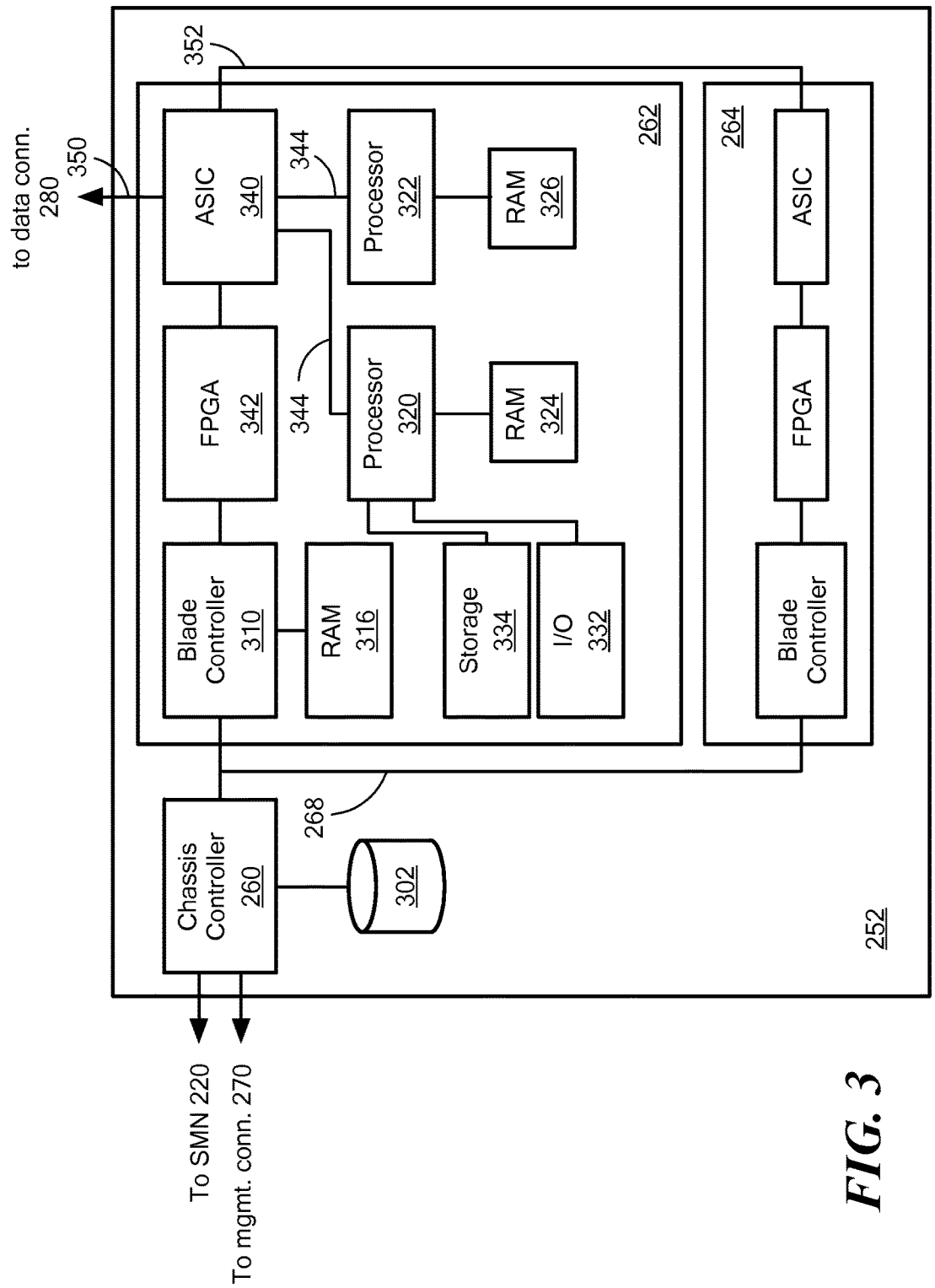
FIG. 3 schematically shows details of an exemplary blade chassis of the HPC system of FIG. 1.

FIG. 3 schematically shows a single blade chassis 252 in more detail. In this figure, parts not relevant to the immediate description have been omitted. The chassis controller 260 is shown with its connections to the system management node 220 and to the management connection 270. The chassis controller 260 may be provided with a chassis data store 302 for storing chassis management data. The chassis data store 302 may be volatile random access memory ("RAM"), in which case data in the chassis data store 302 are accessible by the SMN 220 so long as power is applied to the blade chassis 252, even if one or more of the computing partitions has failed (e.g., due to an OS crash) or a blade has malfunctioned. The chassis data store 302 may be non-volatile storage such as a hard disk drive ("HDD") or a solid state drive ("SSD"). In this case, data in the chassis data store 302 are accessible after the HPC system has been powered down and rebooted.

FIG. 3 shows relevant portions of specific implementations of the blades 262 and 264 for discussion purposes. The blade 262 includes a blade management controller 310 (also called a "blade controller" or "BMC") that executes system management functions at a blade level, in a manner analogous to the functions performed by the chassis controller at the chassis level. For more detail on the operations of the chassis controller and blade controller, see the section entitled "System Operation" below. The blade controller 310 may be implemented as custom hardware, designed by the HPC system designer to permit communication with the chassis controller 260. In addition, the blade controller 310 may have its own RAM 316 to carry out its management functions. The chassis controller 260 communicates with the blade controller of each blade using the local management bus 268, as shown in FIG. 3 and the previous figures.

The blade 262 also includes one or more processors 320, 322 that are connected to RAM 324, 326. Blade 262 may be alternately configured so that multiple processors may access a common set of RAM on a single bus, as is known in the art. It should also be appreciated that processors 320, 322 may include any number of central processing units ("CPUs") or cores, as is known in the art. The processors 320, 322 in the blade 262 are connected to other items, such as a data bus that communicates with I/O devices 332, a data bus that communicates with non-volatile storage 334, and other buses commonly found in standalone computing systems. (For clarity, FIG. 3 shows only the connections from processor 320 to these other devices.) The processors 320, 322 may be, for example, Intel® Core™ processors manufactured by Intel Corporation. The I/O bus may be, for example, a PCI or PCI Express ("PCIe") bus. The storage bus may be, for example, a SATA, SCSI, or Fibre Channel bus. It will be appreciated that other bus standards, processor types, and processor manufacturers may be used with illustrative embodiments of the present invention.

Each blade (e.g., the blades 262 and 264) includes an application-specific integrated circuit 340 (also referred to as an "ASIC", "hub chip", or "hub ASIC") that controls much of its functionality. More specifically, to logically connect the processors 320, 322, RAM 324, 326, and other devices 332, 334 together to form a managed, multi-processor, coherently-shared distributed-memory HPC system, the processors 320, 322 are electrically connected to the hub ASIC 340. The hub ASIC 340 thus provides an interface between the HPC system management functions generated by the SMN 220, chassis controller 260, and blade controller 310, and the computing resources of the blade 262.

In this connection, the hub ASIC 340 connects with the blade controller 310 by way of a field-programmable gate array ("FPGA") 342 or similar programmable device for passing signals between integrated circuits. In particular, signals are generated on output pins of the blade controller 310, in response to commands issued by the chassis controller 260. These signals are translated by the FPGA 342 into commands for certain input pins of the hub ASIC 340, and vice versa. For example, a "power on" signal received by the blade controller 310 from the chassis controller 260 requires, among other things, providing a "power on" voltage to a certain pin on the hub ASIC 340; the FPGA 342 facilitates this task.

The field-programmable nature of the FPGA 342 permits the interface between the blade controller 310 and ASIC 340 to be reprogrammable after manufacturing. Thus, for example, the blade controller 310 and ASIC 340 may be designed to have certain generic functions, and the FPGA 342 may be used advantageously to program the use of those functions in an application-specific way. The communications interface between the blade controller 310 and ASIC 340 also may be updated if a hardware design error is discovered in either module, permitting a quick system repair without requiring new hardware to be fabricated.

Also in connection with its role as the interface between computing resources and system management, the hub ASIC 340 is connected to the processors 320, 322 by way of a high-speed processor interconnect 344. In one embodiment, the processors 320, 322 are manufactured by Intel Corporation which provides the Intel® QuickPath Interconnect ("QPI") for this purpose, and the hub ASIC 340 includes a module for communicating with the processors 320, 322 using QPI. Other embodiments may use other processor interconnect configurations.

The hub chip 340 in each blade also provides connections to other blades for high-bandwidth, low-latency data communications. Thus, the hub chip 340 includes a link 350 to the computing connection 280 that connects different blade chassis. This link 350 may be implemented using networking cables, for example. The hub ASIC 340 also includes connections to other blades in the same blade chassis 252. The hub ASIC 340 of blade 262 connects to the hub ASIC 340 of blade 264 by way of a chassis computing connection 352. The chassis computing connection 352 may be implemented as a data bus on a backplane of the blade chassis 252 rather than using networking cables, advantageously allowing the very high speed data communication between blades that is required for high-performance computing tasks. Data communication on both the inter-chassis computing connection 280 and the intra-chassis computing connection 352 may be implemented using the NumaLink protocol or a similar protocol.

System Operation

System management commands generally propagate from the SMN 220, through the management connection 270 to the blade chassis (and their chassis controllers), then to the blades (and their blade controllers), and finally to the hub ASICS that implement the commands using the system computing hardware.

For example, consider the process of powering on an HPC system. The HPC system 100 is powered when a system operator issues a "power on" command from the SMN 220. The SMN 220 propagates this command to each of the blade chassis 252-258 by way of their respective chassis controllers, such as chassis controller 260 in blade chassis 252. Each chassis controller, in turn, issues a "power on" command to each of the respective blades in its blade chassis by way of their respective blade controllers, such as blade controller 310 of blade 262. Blade controller 310 issues a "power on" command to its corresponding hub chip 340 using the FPGA 342, which provides a signal on one of the pins of the hub chip 340 that allows it to initialize. Other commands propagate similarly.

Once the HPC system is powered on, its computing resources may be divided into computing partitions. The quantity of computing resources that are allocated to each computing partition is an administrative decision. For example, an enterprise may have a number of projects to complete, and each project is projected to require a certain amount of computing resources. Different projects may require different proportions of processing power, memory, and I/O device usage, and different blades may have different quantities of the resources installed. The HPC system administrator takes these considerations into account when partitioning the computing resources of the HPC system 100. Partitioning the computing resources may be accomplished by programming each blade's RAM 316. For example, the SMN 220 may issue appropriate blade programming commands after reading a system configuration file.

The collective hardware computing resources of the HPC system 100 may be divided into computing partitions according to any administrative need. Thus, for example, a single computing partition may include the computing resources of some or all of the blades of one blade chassis 252, all of the blades of multiple blade chassis 252 and 254, some of the blades of one blade chassis 252 and all of the blades of blade chassis 254, all of the computing resources of the entire HPC system 100, or other similar combinations. Hardware computing resources may be partitioned statically, in which case a reboot of the entire HPC system 100 is required to reallocate hardware. Alternatively and preferably, hardware computing resources are partitioned dynamically while the HPC system 100 is powered on. In this way, unallocated resources may be assigned to a partition without interrupting the operation of other partitions.

It should be noted that once the HPC system 100 has been appropriately partitioned, each partition may be considered to act as a standalone computing system. Thus, two or more partitions may be combined to form a logical computing group inside the HPC system 100. Such grouping may be necessary if, for example, a particular computational task is allocated more processors or memory than a single operating system can control. For example, if a single operating system can control only 64 processors, but a particular computational task requires the combined power of 256 processors, then four partitions may be allocated to the task in such a group. This grouping may be accomplished using techniques known in the art, such as installing the same software on each computing partition and providing the partitions with a VPN.

Once at least one partition has been created, the partition may be booted and its computing resources initialized. Each computing partition, such as partition 160, may be viewed logically as having a single OS 191 and a single BIOS 192. As is known in the art, a BIOS is a collection of instructions that electrically probes and initializes the available hardware to a known state so that the OS can boot, and is typically provided in a firmware chip on each physical server. However, a single logical computing partition 160 may span several blades, or even several blade chassis. A blade may be referred to as a "computing node" or simply a "node" to emphasize its allocation to a particular partition; however, it will be understood that a physical blade may comprise more than one computing node if it has multiple processors 320, 322 and memory 324, 326.

Booting a partition may require a number of modifications to be made to a standard blade chassis. In particular, the BIOS in each blade is modified to determine other hardware resources in the same computing partition, not just those in the same blade or blade chassis. After a boot command has been issued by the SMN 220, the hub ASIC 340 eventually provides an appropriate signal to the processor 320 to begin the boot process using BIOS instructions. The BIOS instructions, in turn, obtain partition information from the hub ASIC 340 such as: an identification (node) number in the partition, a node interconnection topology, a list of devices that are present in other nodes in the partition, a master clock signal used by all nodes in the partition, and so on. Armed with this information, the processor 320 may take whatever steps are required to initialize the blade 262, including 1) non-HPC-specific steps such as initializing I/O devices 332 and non-volatile storage 334, and 2) also HPC-specific steps such as synchronizing a local hardware clock to a master clock signal, initializing HPC-specialized hardware in a given node, managing a memory directory that includes information about which other nodes in the partition have accessed its RAM, and preparing a partition-wide physical memory map.

At this point, each physical BIOS has its own view of the partition, and all of the computing resources in each node are prepared for the OS to load. The BIOS then reads the OS image and executes it, in accordance with techniques known in the art of multiprocessor systems. The BIOS presents to the OS a view of the partition hardware as if it were all present in a single, very large computing device, even if the hardware itself is scattered among multiple blade chassis and blades. In this way, a single OS instance spreads itself across some, or preferably all, of the blade chassis and blades that are assigned to its partition. Different operating systems may be installed on the various partitions. If an OS image is not present, for example immediately after a partition is created, the OS image may be installed using processes known in the art before the partition boots.

Once the OS is safely executing, its partition may be operated as a single logical computing device. Software for carrying out desired computations may be installed to the various partitions by the HPC system operator. Users may then log into the SMN 220. Access to their respective partitions from the SMN 220 may be controlled using volume mounting and directory permissions based on login credentials, for example. The system operator may monitor the health of each partition, and take remedial steps when a hardware or software error is detected. The current state of long-running application programs may be saved to non-volatile storage, either periodically or on the command of the system operator or application user, to guard against losing work in the event of a system or application crash. The system operator or a system user may issue a command to shut down application software. Other operations of an HPC partition may be known to a person having ordinary skill in the art. When administratively required, the system operator may shut down a computing partition entirely, reallocate or deallocate computing resources in a partition, or power down the entire HPC system 100.

Twin Server Blade Configuration

Figure 4A:
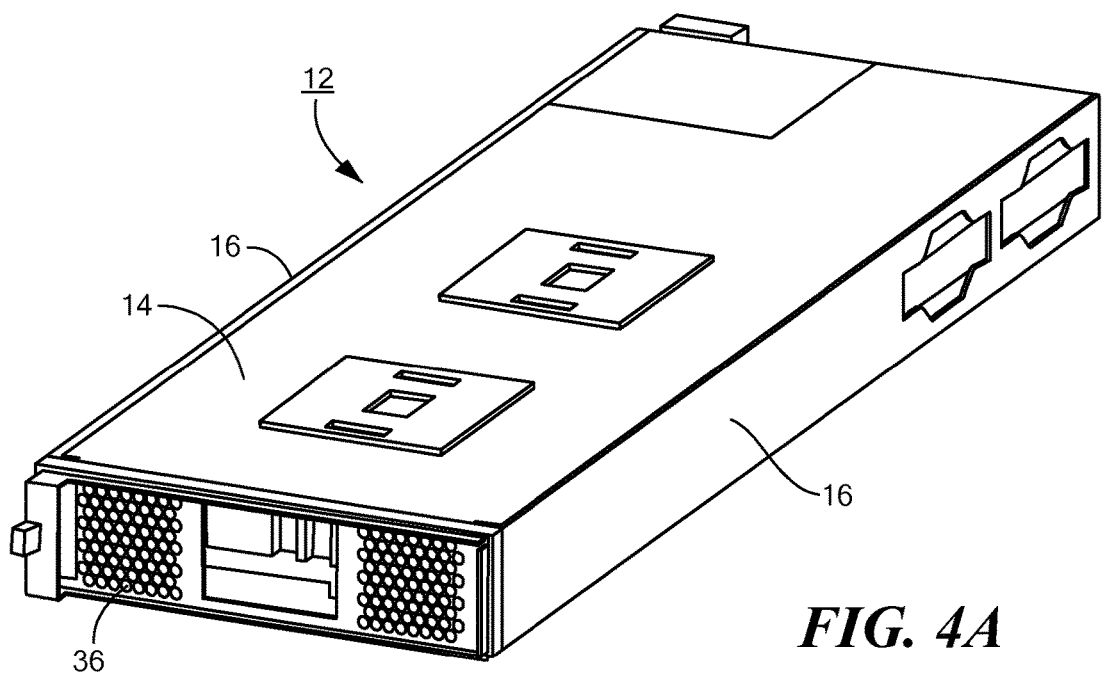
FIGS. 4A and 4B schematically show a front perspective view of the top and a rear perspective view of the bottom, respectively, of a compute blade in accordance with an embodiment of the present invention.
Figure 4B:
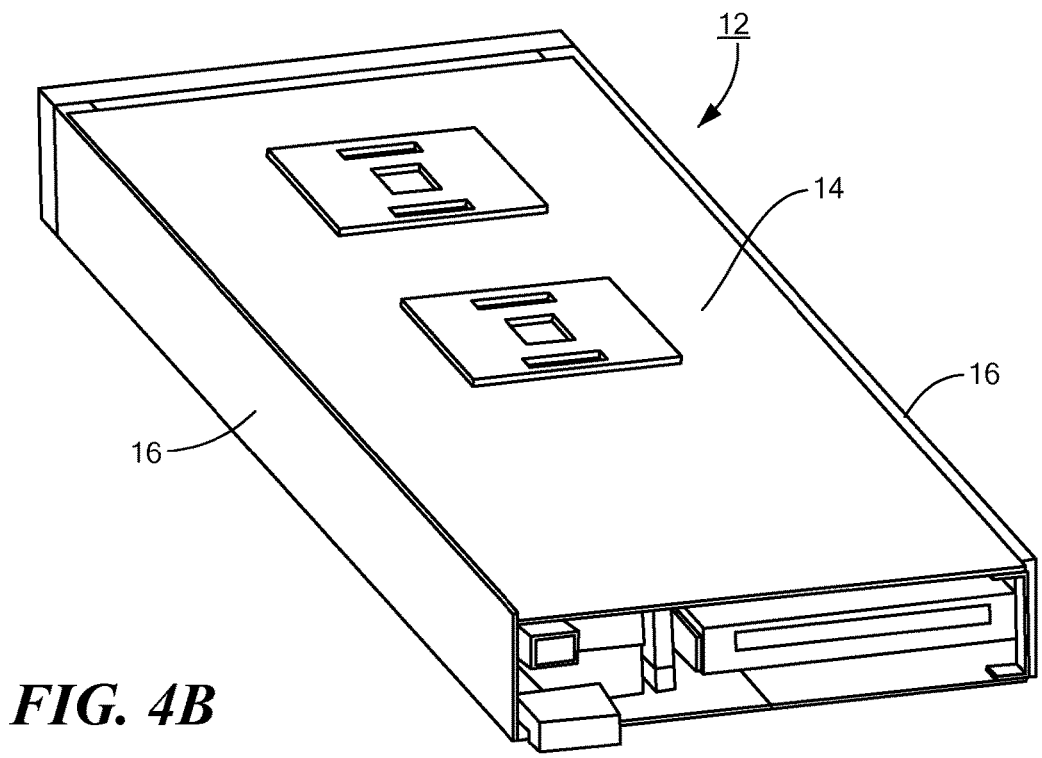
Figure 4C:
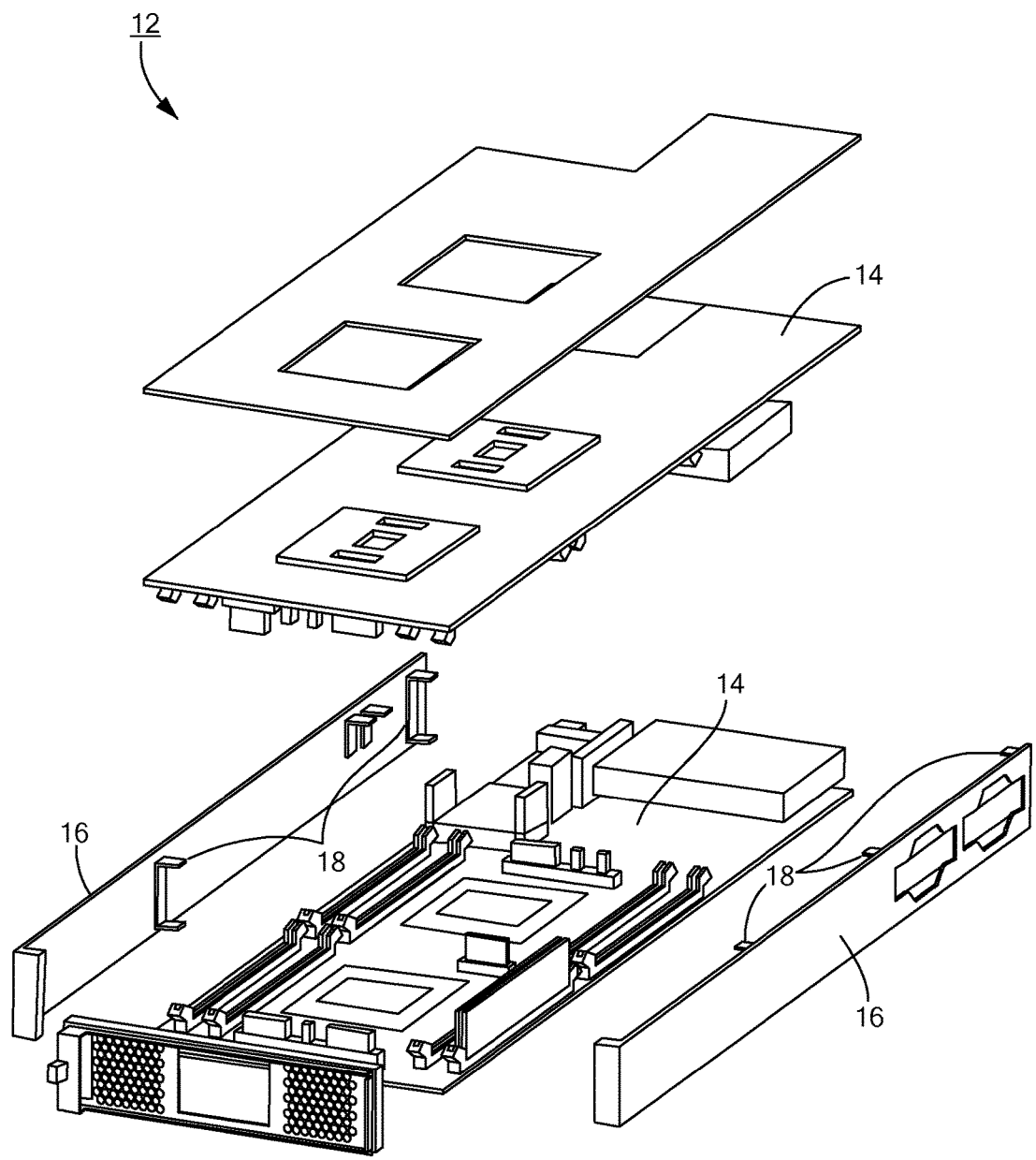
FIGS. 4C and 4D schematically show exploded views of a front perspective view of the top and front perspective view of the bottom, respectively, of a compute blade in accordance with an embodiment of the present invention.
Figure 4D:
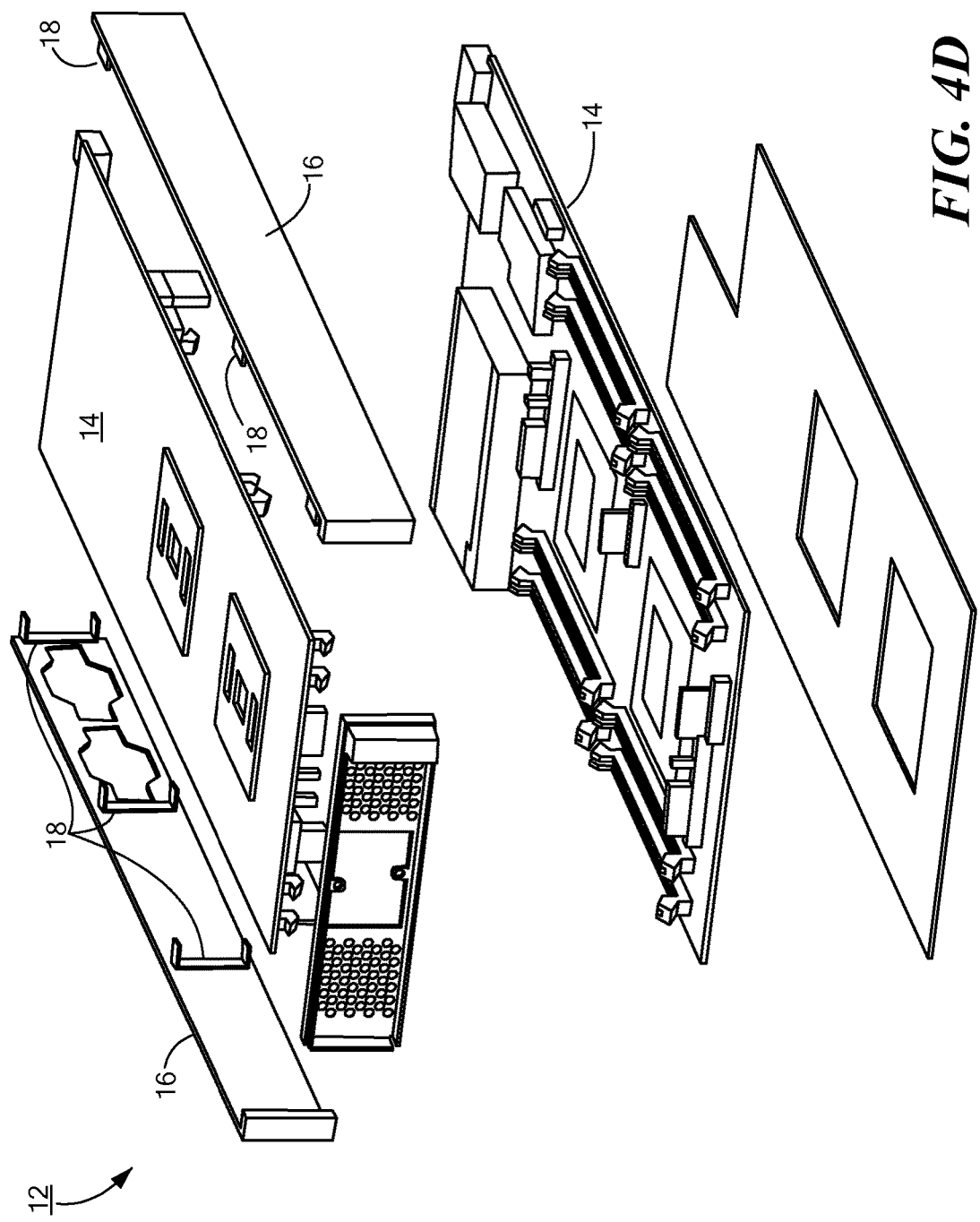

FIGS. 4A through 4D schematically show various views of a compute blade 12 that may be used in an HPC system 100 according to embodiments of the present invention. The compute blade 12 includes one or more computing boards 14 and two side rails 16 disposed at either side of the computing board 14. As shown in FIGS. 4C and 4D, each side rail 16 has one or more board alignment elements 18 configured to hold the computing board 14 within the computing blade 12. As shown in more detail in FIG. 5, the board alignment element 18 includes a board attachment portion 18a that is configured to couple to the computing board 14 such that a top 14a of the computing board 14 is adjacent to the board attachment portion 18a. The benefit of this configuration of the side rails 16 and board alignment elements 18 is that it permits a wide variety of functional board assemblies to be used since the board mounting features are configured for top-of-board alignment rather than the bottom 14b of the board 14. This allows for better control of the blade alignment tolerances and enables a wider range of board thicknesses to be used. In addition, the use of side rails 16 and board alignment elements 18 to mount the computing boards 14 within the blade 12 eliminates the need for a pan or carrier tray, which minimizes the weight and material used in the blade 12, and thus reduces the weight of the overall HPC system 100.

Figure 5:
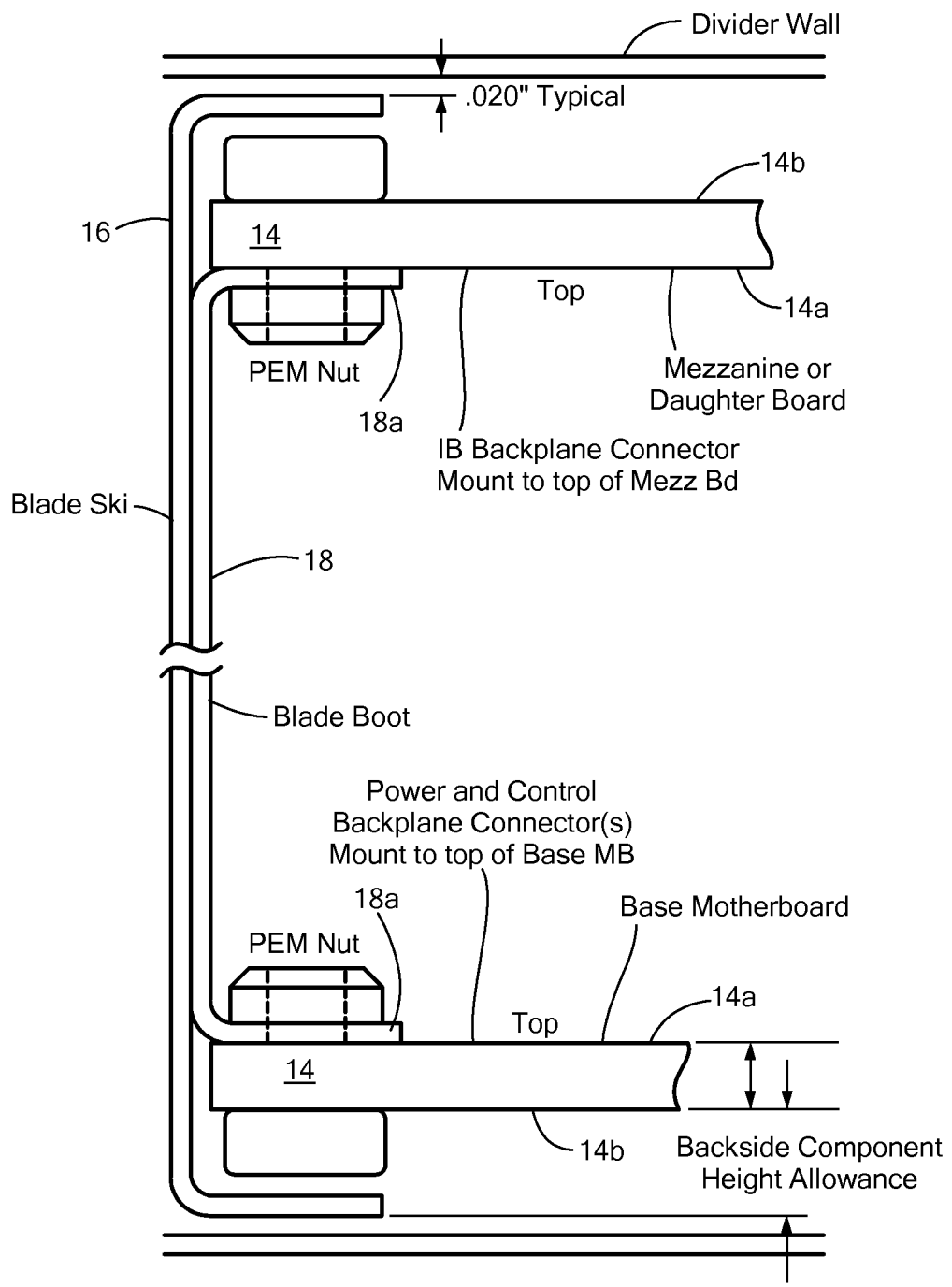
FIG. 5 shows a front view of one board alignment element in a side rail.
Figure 6:
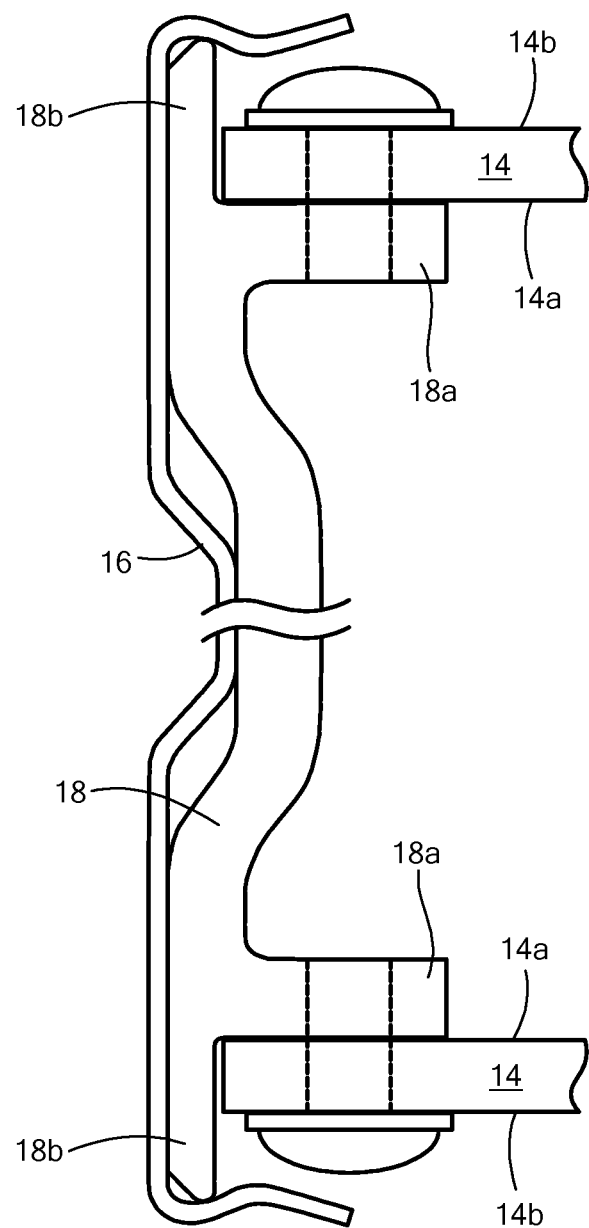
FIG. 6 shows an alternative configuration of a board alignment element in accordance with embodiments of the present invention.

The side rails 16 and board alignment elements 18 may be configured in a variety of ways. Preferably, the board attachment portion 18a includes a relatively flat area that is substantially perpendicular to the main portion of the side rails 16 so that the computing boards 14 are held substantially parallel to one another within the blade 12. For example, as shown in FIG. 5, the board alignment element 18 may be c-shaped with upper and lower board attachment portions 18a substantially perpendicular to the side rails 16 such that the top 14 of the computing board 14 is adjacent to and coupled to an outer side of the board attachment portions 18a. Alternatively, the board alignment element 18 may have other shapes, such as shown in FIG. 6. The board alignment element 18 may also include a mounting section 18b that extends beyond the board attachment portion 18a, as shown in FIG. 6. The mounting section 18b may be configured to engage with and couple the board alignment element 18 to the side rail 16, such as in a snap-fit configuration.

Figure 7A:
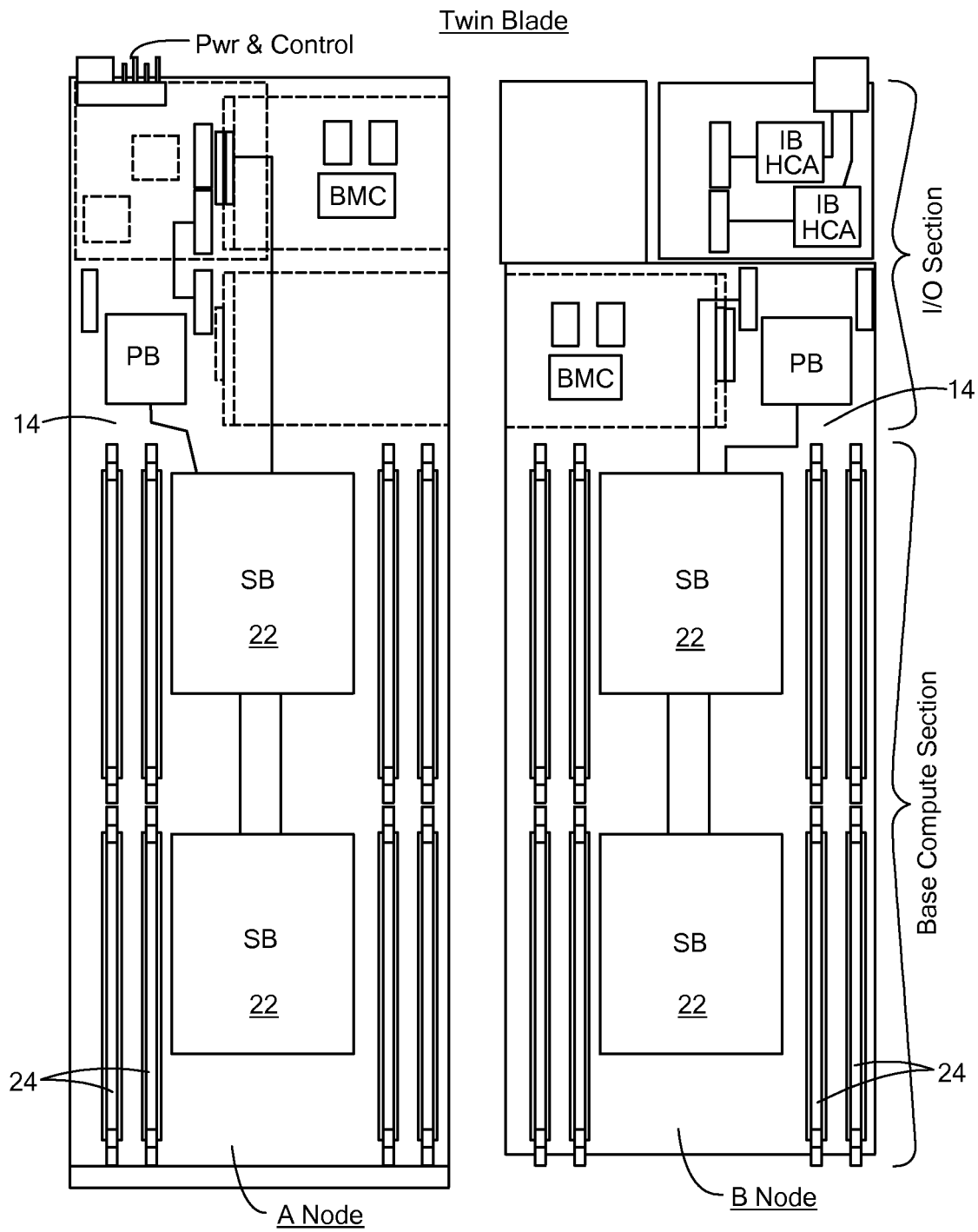
FIGS. 7A and 7B schematically show a plan view of two nodes and a side view of the two nodes assembled, respectively, in a two-node blade with an air-cooled heat sink in accordance with an embodiment of the present invention.
Figure 7B:
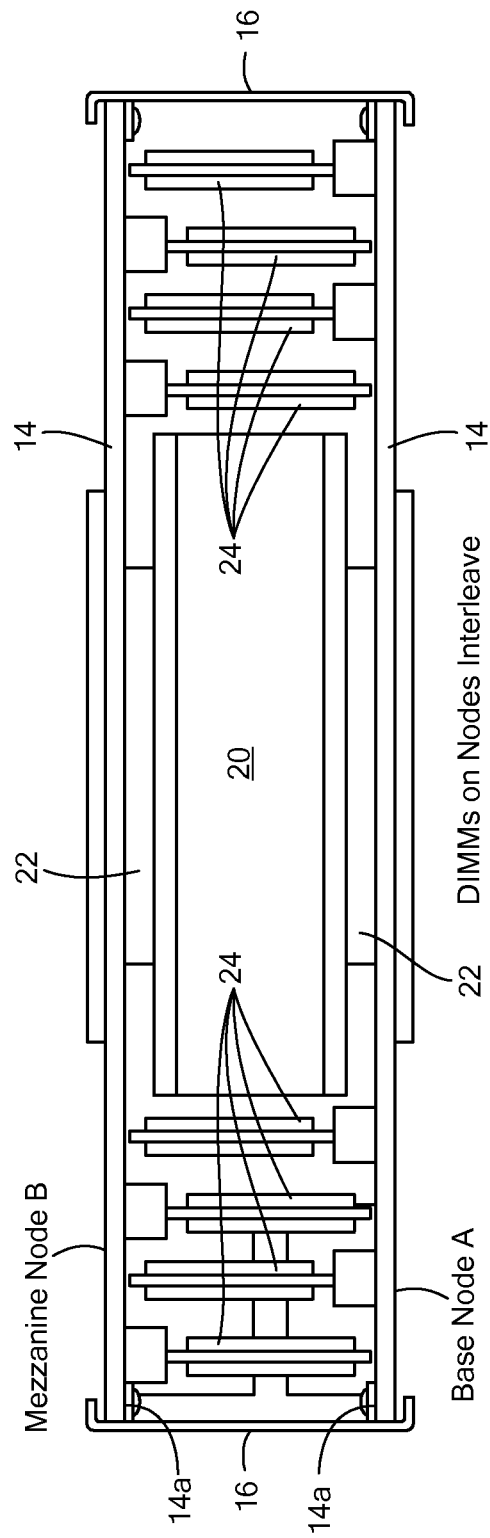

Another benefit of mounting the computing boards 14 on the sides within the blade 12 using the side rail 16 and board alignment element 18 configuration is that two or more computing boards 14 may be readily stacked on top of one another within the blade 12, such as shown in FIGS. 4A through 4D and 7B. This configuration allows the top 14a of one computing board 14 to face the top 14a of the other computing board 14, which allows the two boards 14 to share components within the blade 12. For example, as shown in FIGS. 7A and 7B, an air-cooled heat sink 20 may be disposed between the two processors 22 on opposing computing boards 14.

Figure 13A:
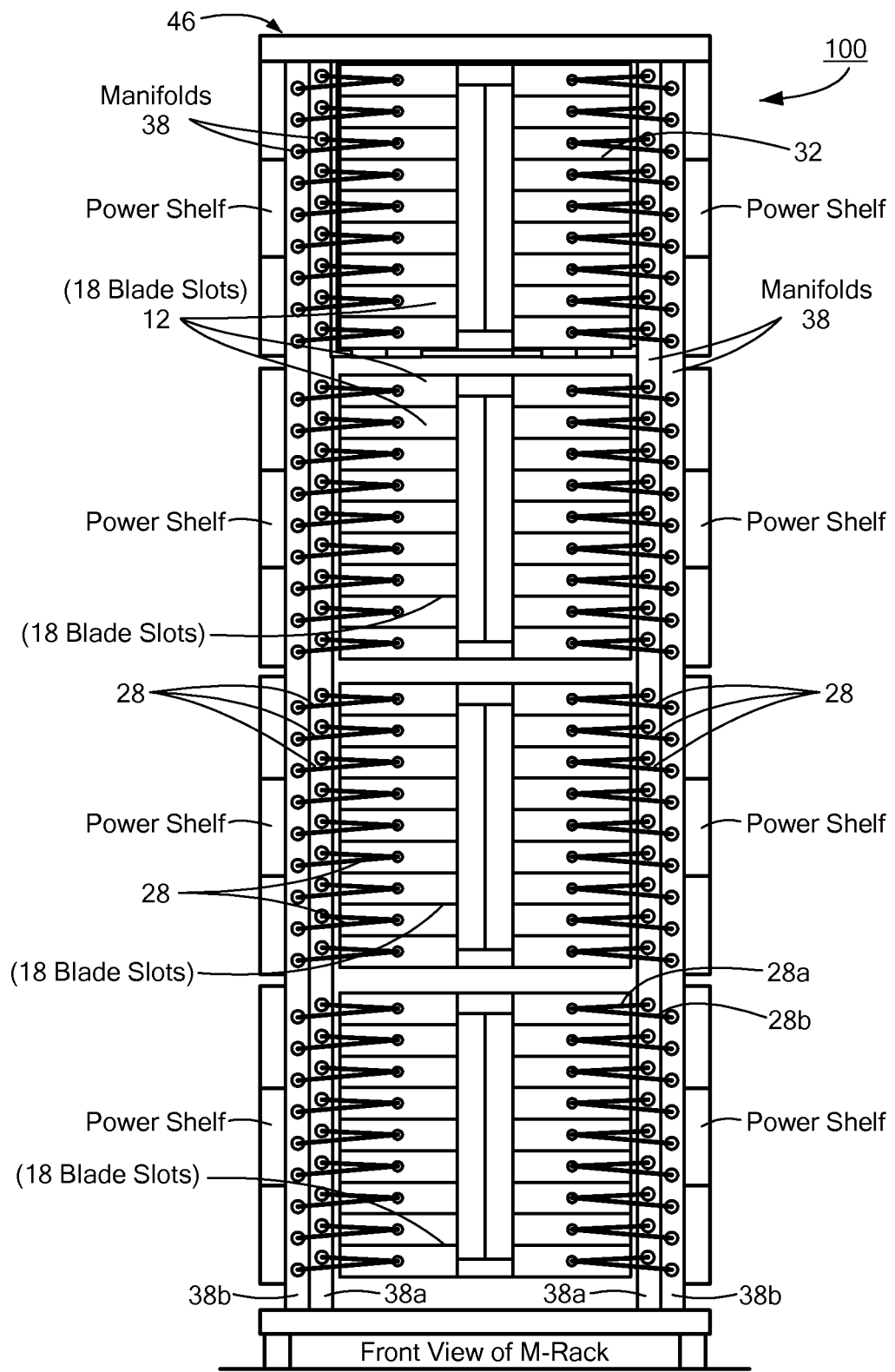
FIGS. 13A and 13B schematically show a front view and a front perspective view, respectively, of an M-Rack configuration used with embodiments of the present invention.
Figure 13B:
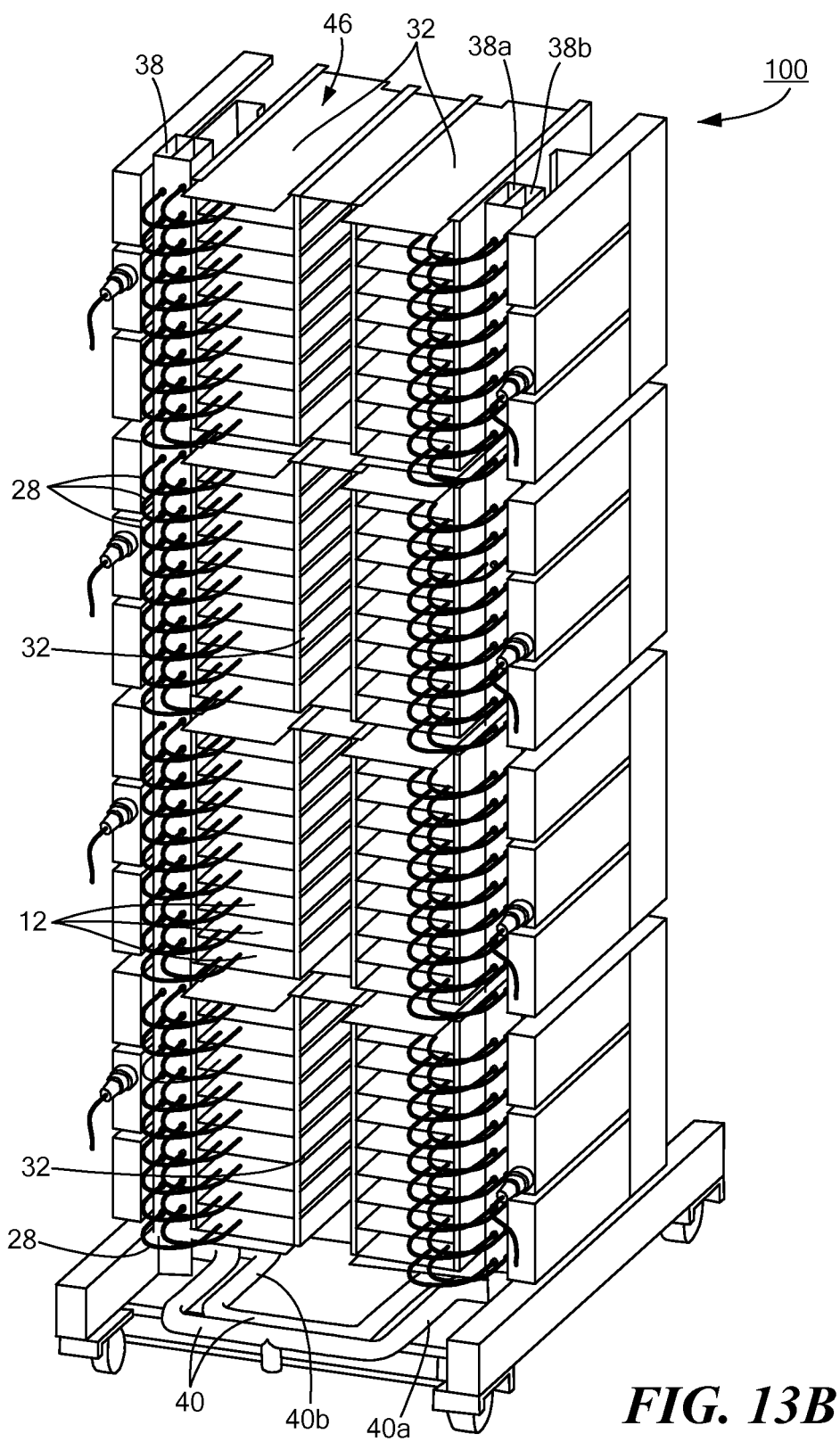

The computing boards 14 may include MIC (many-integrated-core) or CPU (graphics processing unit) dense form factor cards. Preferably, each computing board 14 may be configured as a separate computing node, so that the computing blade 12 includes two computing nodes that are logically independent, but that are physically joined together and share various hardware components, in order to share a single slot in a blade enclosure, such as shown in FIGS. 13A and 13B below. In this way, the loss of one computing board 14 does not render the entire computing blade 12 inoperable. This twin node configuration effectively doubles the achievable compute density over existing single node blade configurations.

Another benefit of a compute blade 12 configuration according to embodiments of the present invention is that a common layout or infrastructure may be used on both the base node (designated "A Node") and the mezzanine node (designated "B Node") in the base compute section, such as shown in FIG. 7A. This blade configuration also allows for the interleaving of components (e.g., memory 24), which provides for a more compact configuration and saves space, and also allows for a simpler design by leveraging one design across both boards 14 in the base compute section.

In addition, the blade 12 configuration allows for a variety of cooling systems. For example, the blade 12 may be air cooled, liquid cooled, or a combination of the two, such as described in more detail in the sections entitled "On-Blade Cooling System" and "Closed-loop Cooling Cell Configuration with CDU" below.

On-Blade Cooling System

Figure 8A:
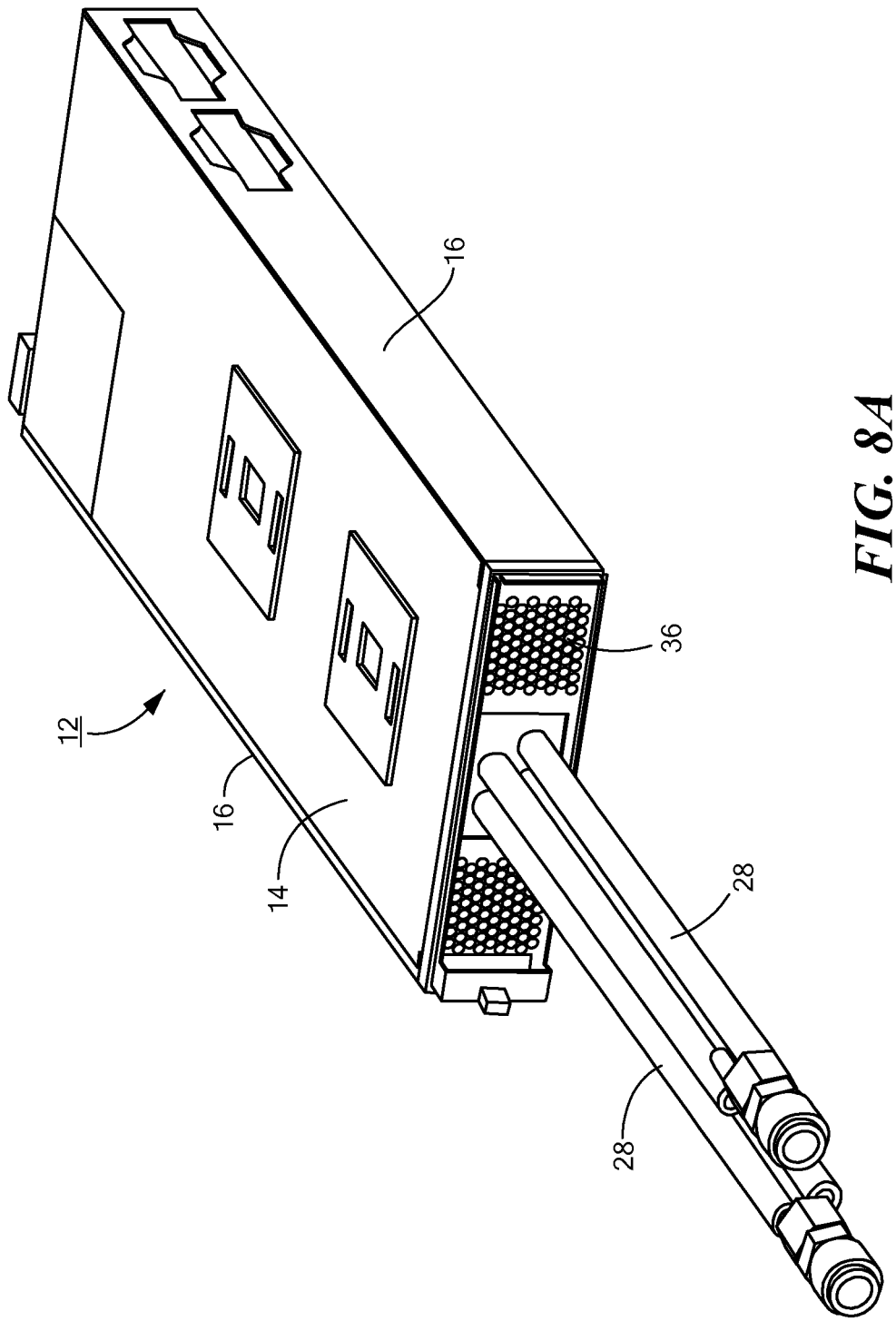
FIGS. 8A and 8B show a top perspective view and an exploded view, respectively, of a blade with an on-blade cold sink in accordance with an embodiment of the present invention.
Figure 8B:
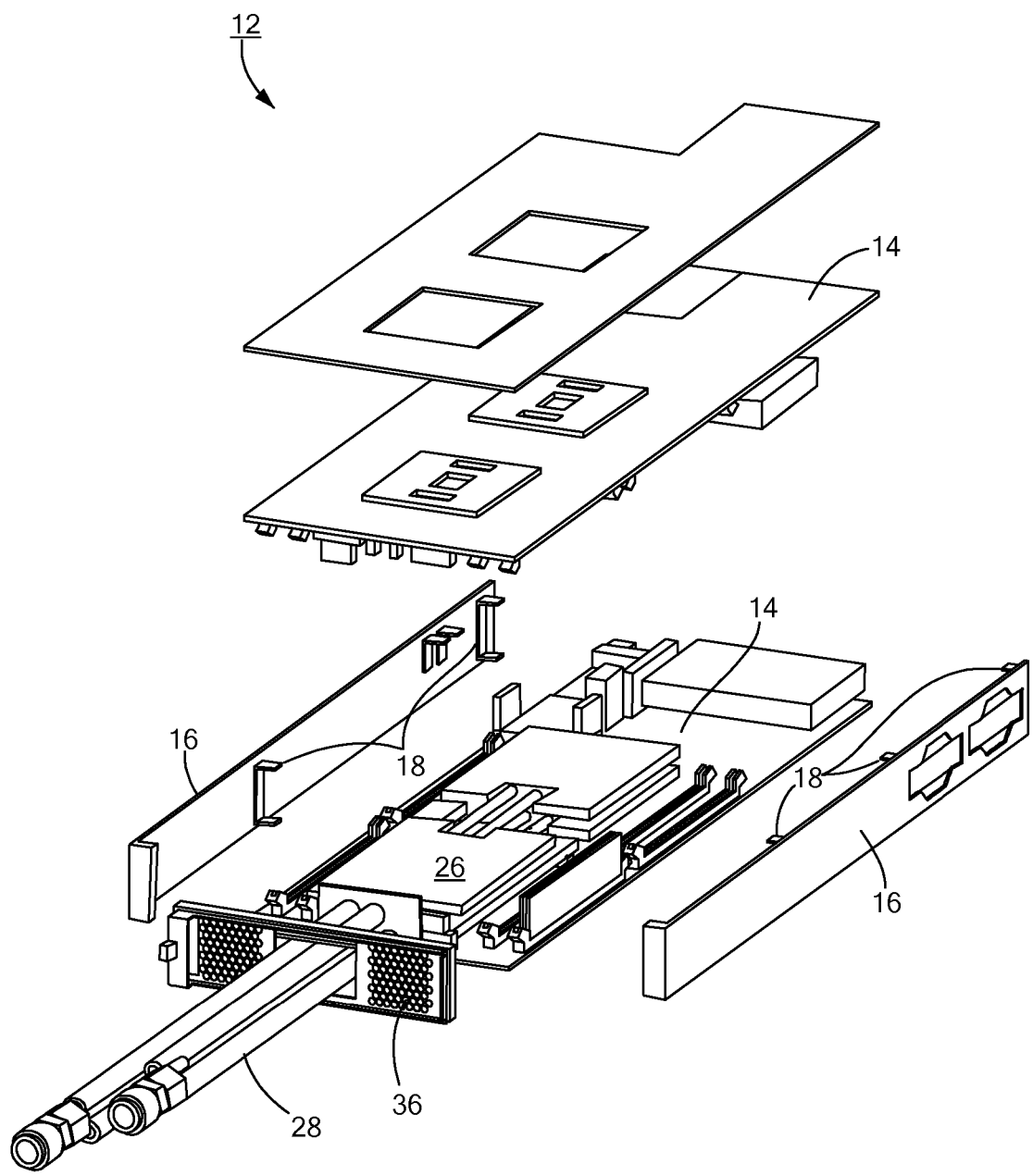

FIGS. 8A and 8B schematically show a compute blade 12 configuration that includes an on-blade cooling system. The on-blade cooling system includes one or more cooling plates 26 and fluid connections 28 coupled to the cooling plates 26 and in fluid communication with a cooling manifold 30 in a blade enclosure 32 (as shown in FIGS. 13A and 13B). The one or more cooling plates 26 are configured to be disposed between two computing boards 14 and located between the processor cores 22 on the upper and lower computing boards 14. Depending on the configuration, the on-blade cooling system may absorb approximately 50-60% of the heat dissipated by an individual dual-socket node in a computing blade 12.

Figure 9A:
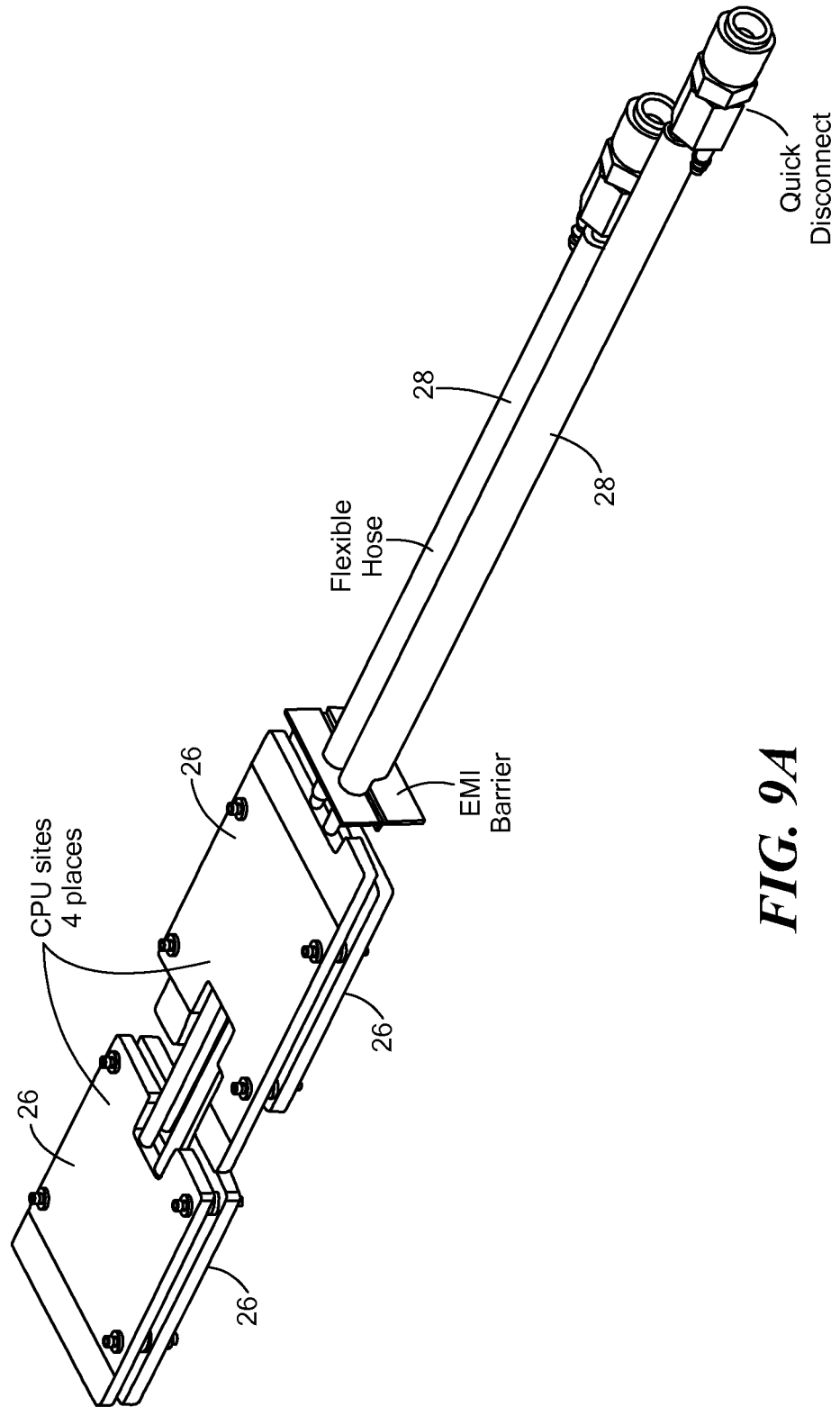
FIG. 9A schematically shows a top perspective view of a double cold sink plate configuration and FIG. 9B shows a top perspective view of a single cold sink plate configuration in accordance with an embodiment of the present invention.
Figure 9B:
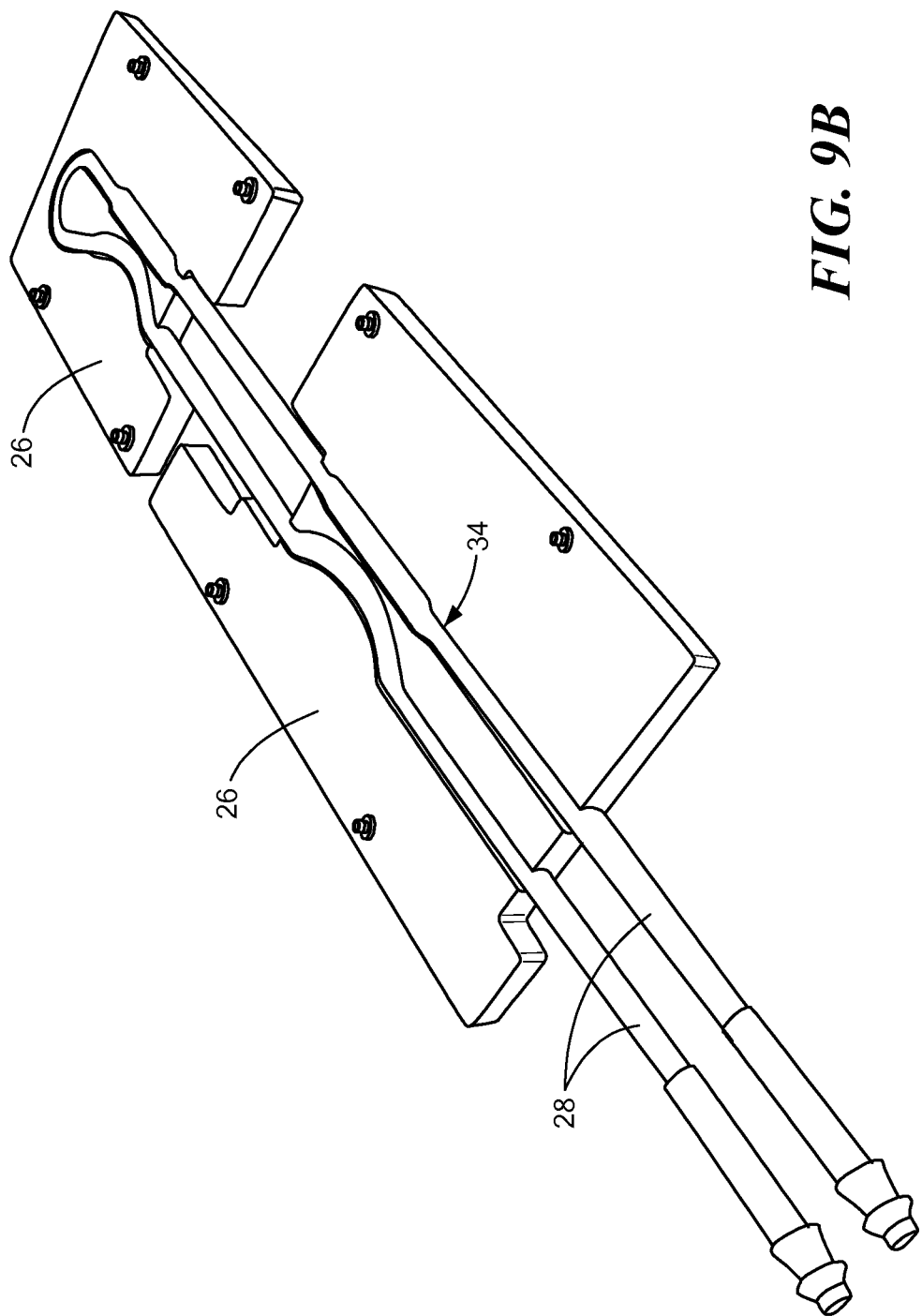

The on-blade cooling system may include one or more cooling plates 26 disposed on top of one another, such as shown in FIG. 9A, or one or more cooling plates 26 in a side-by-side configuration, such as shown in FIG. 9B. Preferably, as shown in FIG. 8B, two cooling plates 26 are disposed between the two computing boards in one region of the computing blade 12 and two cooling plates 26 are disposed between the two computing boards in another region of the computing blade 12, so that each processor 22 in the computing board 14 has its own cooling plate 26. A bulkhead or front plate 36 of the computing blade 12 may be readily removed in order to allow access to the internal portions of the computing blade 12 and allow the installation and removal of the cooling plates 26 without blade disassembly. In addition, the front plate 36 may provide an electromagnetic interference (EMI) barrier between the internal computing blade components and the exterior environment.

As shown in more detail in FIG. 9B, the cooling plates 26 may have internal passages 34 that allow a cooling liquid (e.g., water) to flow through the passages in order to remove the heat in the cooling plates 26. The heat is generated by the processors 22 in the computing blade 12 and absorbed by the cooling plates 26. Further details of the on-blade cooling system and cooling plate 26 configuration can be found in the application entitled ON-BLADE COLD SINK FOR HIGH-DENSITY CLUSTERED COMPUTER SYSTEM, which is incorporated by reference herein in its entirety.

Figure 10A:
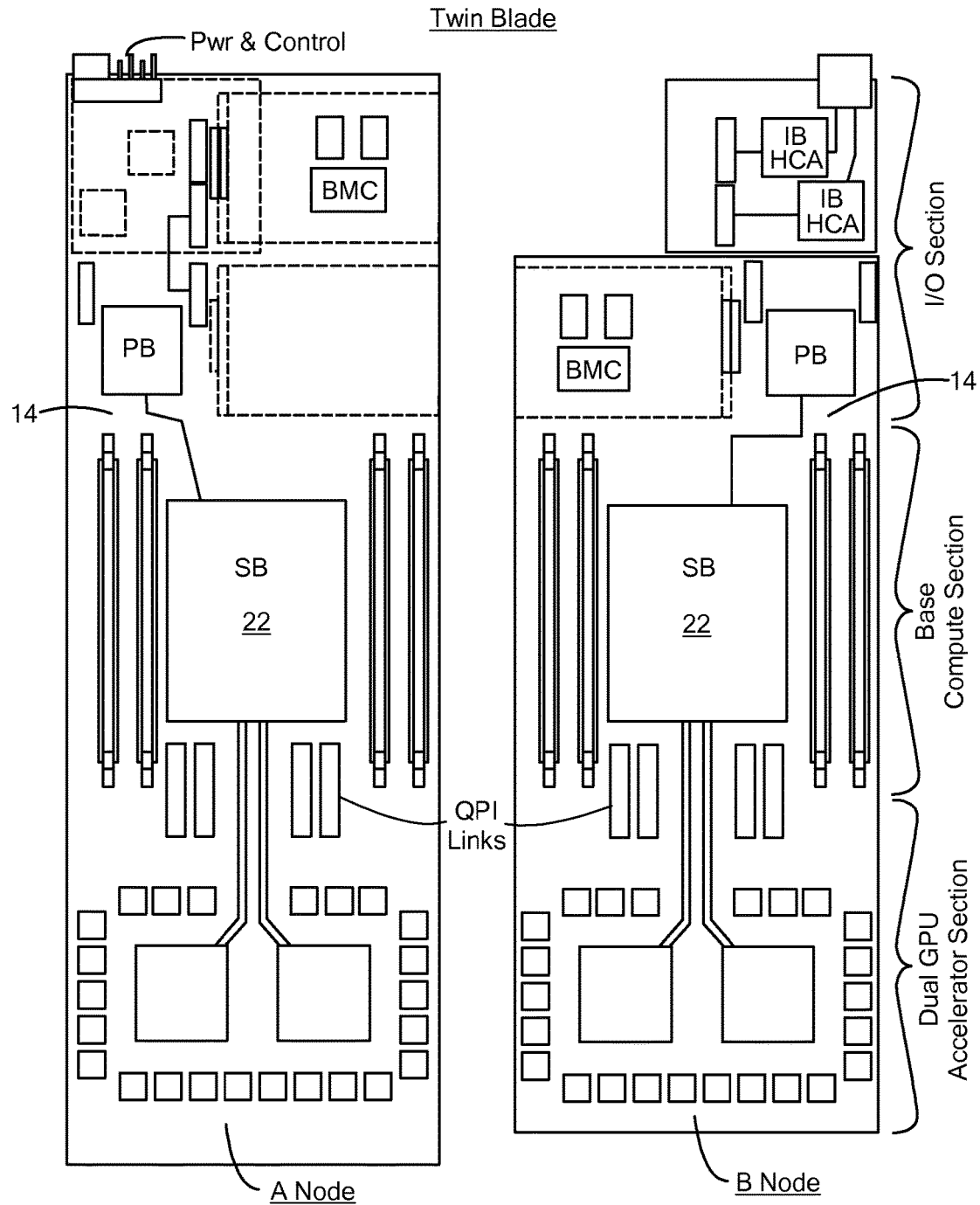
FIGS. 10A and 10B schematically show a plan view of two nodes and a side view of the two nodes assembled, respectively, in a two-node blade with a single cold sink configuration in accordance with an embodiment of the present invention.
Figure 10B:
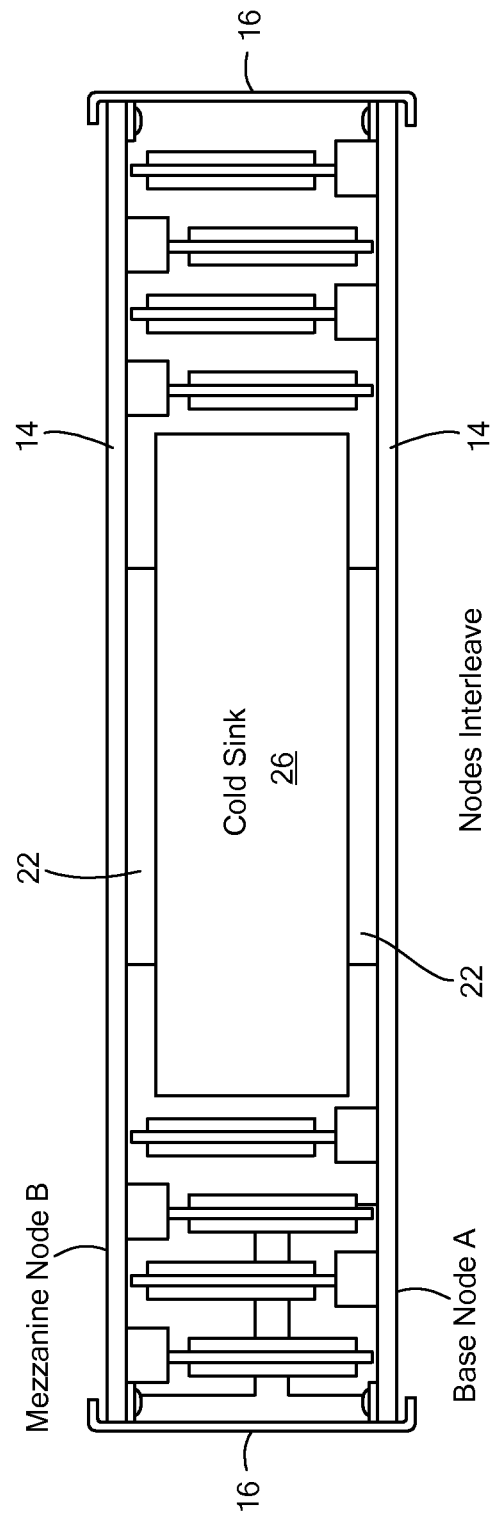
Figure 11A:
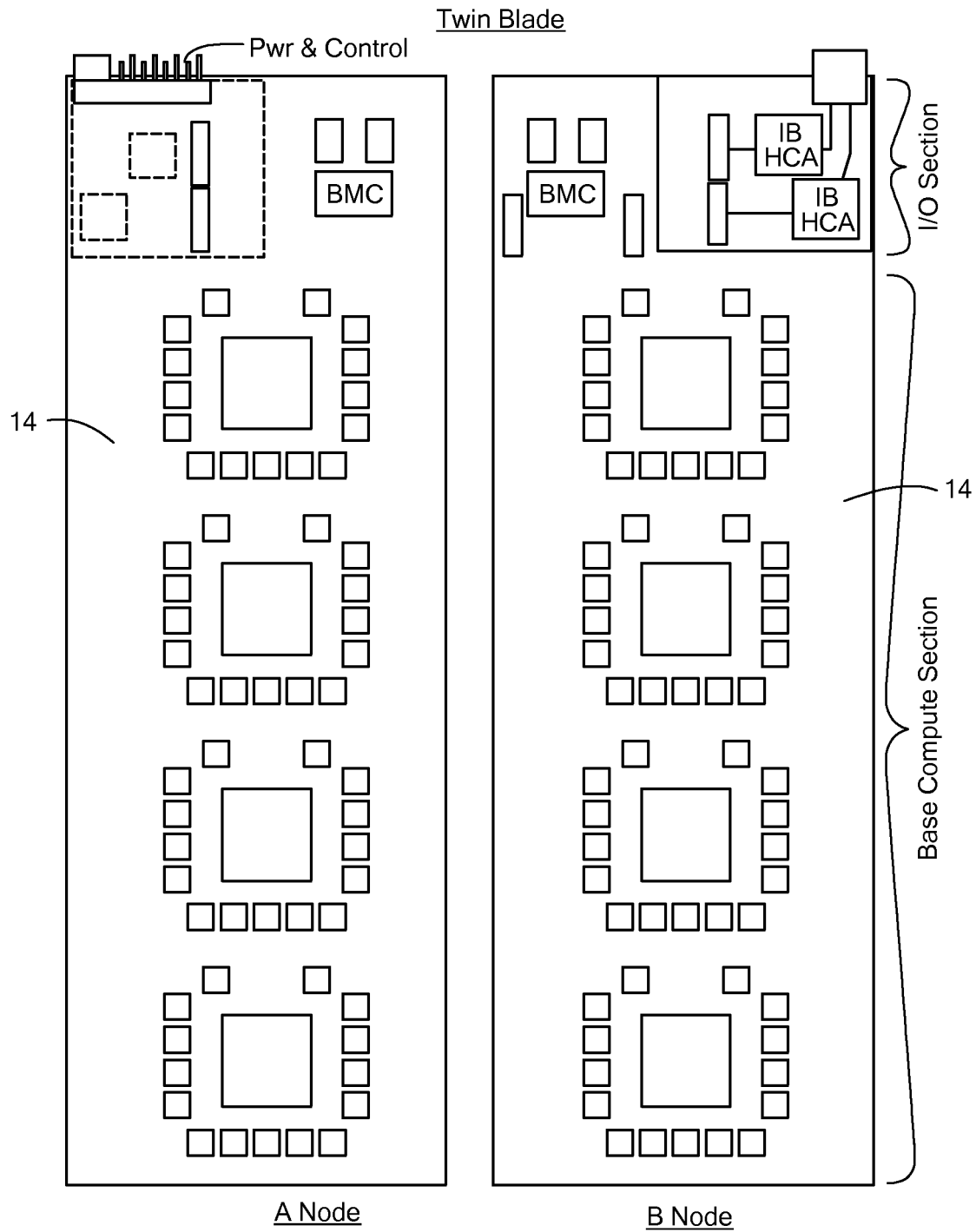
FIGS. 11A and 11B schematically show a plan view of two nodes and a side view of the two nodes assembled, respectively, in a two-node blade with a double cold sink configuration in accordance with an embodiment of the present invention.
Figure 11B:
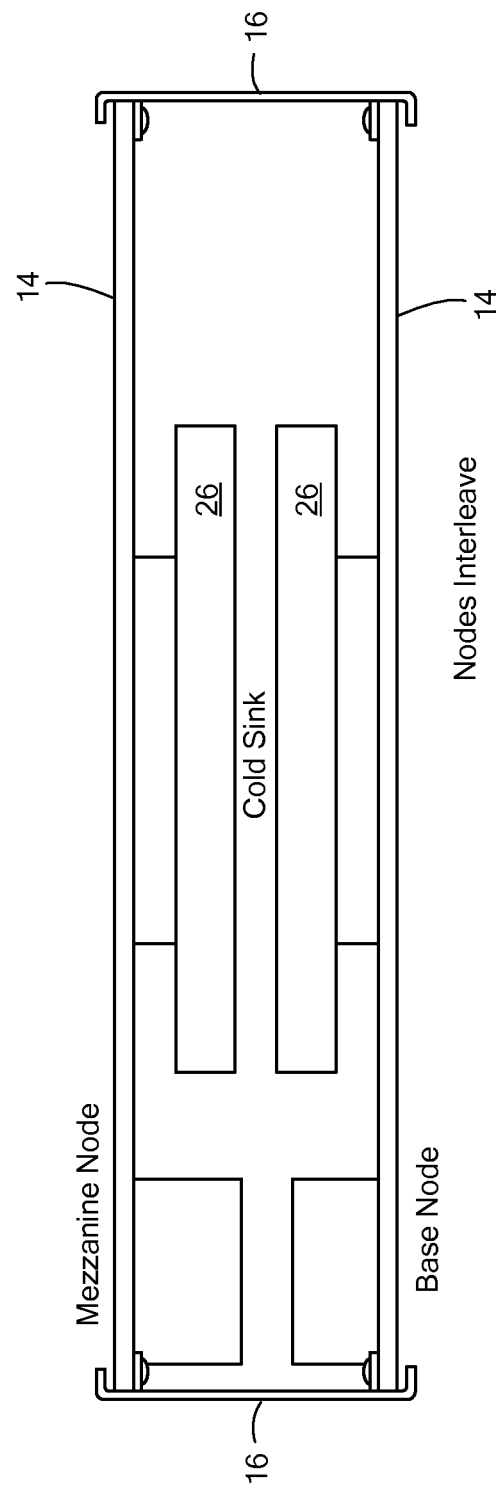

The cooling plates 26 may replace the heat sinks typically used with processors within computing blades 12. For example, FIGS. 10A and 10B show a computing blade 12 configuration in which a single set of cooling plates 26 are disposed between opposing boards 14, and FIGS. 11A and 11B show a computing blade 12 configuration in which two sets of cooling plates 26 are disposed between opposing boards 14, so that each processor 22 is adjacent to its own cooling plate 26.

Figure 12:
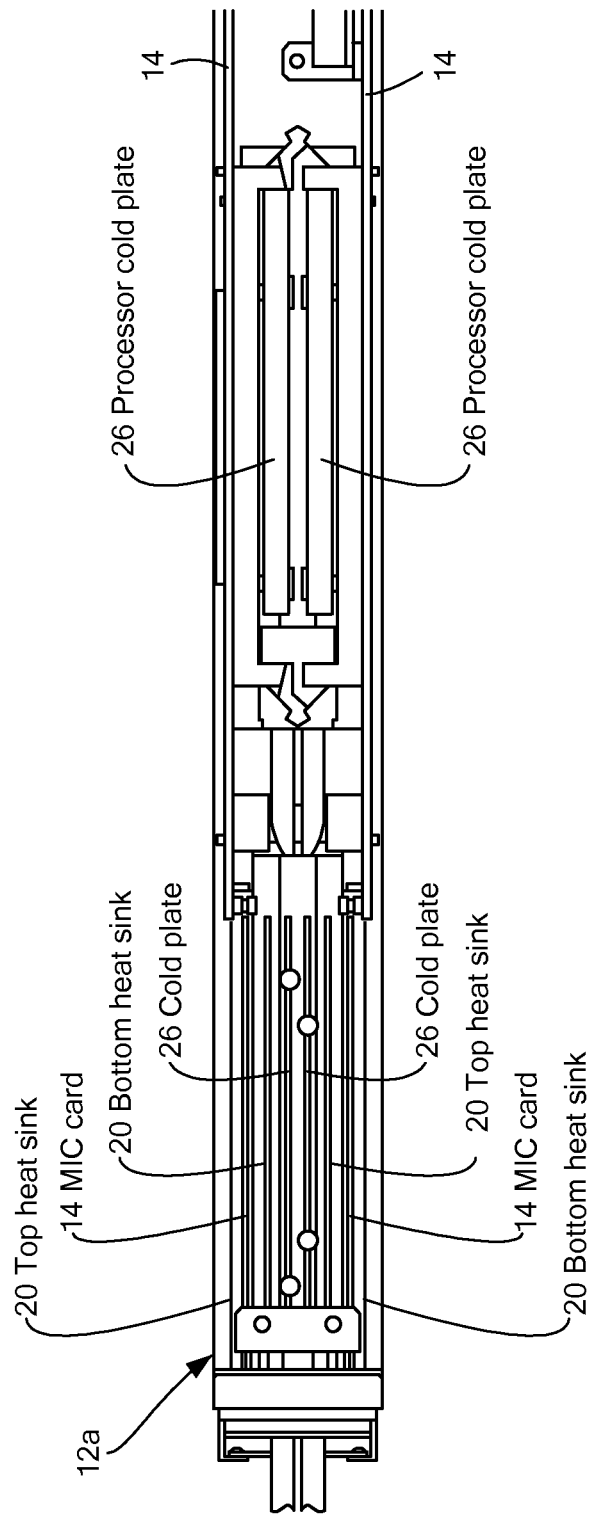
FIG. 12 schematically shows a side view of a blade with an on-blade cold sink in accordance with an embodiment of the present invention.

Alternatively, the cooling plates 26 may be used in conjunction with air-cooled heat sinks, such as shown in FIG. 12. For example, in one region of the computing blade 12 (e.g., region 12a), heat sinks 20 may be placed on either side of a computing board 14 and then a cooling plate 26 may be placed adjacent to one or more of the heat sinks 20. Any additional heat may be air cooled by fans located at the back of the rack or air-cooled by a closed-loop air flow configuration as discussed in more detail in the section entitled "Closed-loop Cooling Cell Configuration with CDU" below.

FIGS. 13A and 13B schematically show an HPC system 100 using the on-blade cooling system. In addition to the cooling plates 26 and fluid connections 28, the on-blade cooling system includes one or more blade enclosures 32 having a cooling manifold 38 and configured to hold a plurality of computing blades 12. The cooling manifold 38 may include a dedicated supply line 38a and a return line 38b, which may be fluidly coupled to a respective supply line 28a and return line 28b of the fluid connection 28. The cooling manifold 38 may be vertically disposed along a side of the blade enclosure 32, such as shown in FIGS. 13A and 13B, or may be horizontally and vertically disposed. However, placing the connections of the cooling manifold 38 to the fluid connections 28 towards the front of the blade enclosure 32 readily allows visual inspection of the fluid connections 28 in case of any leaks.

Figure 14:
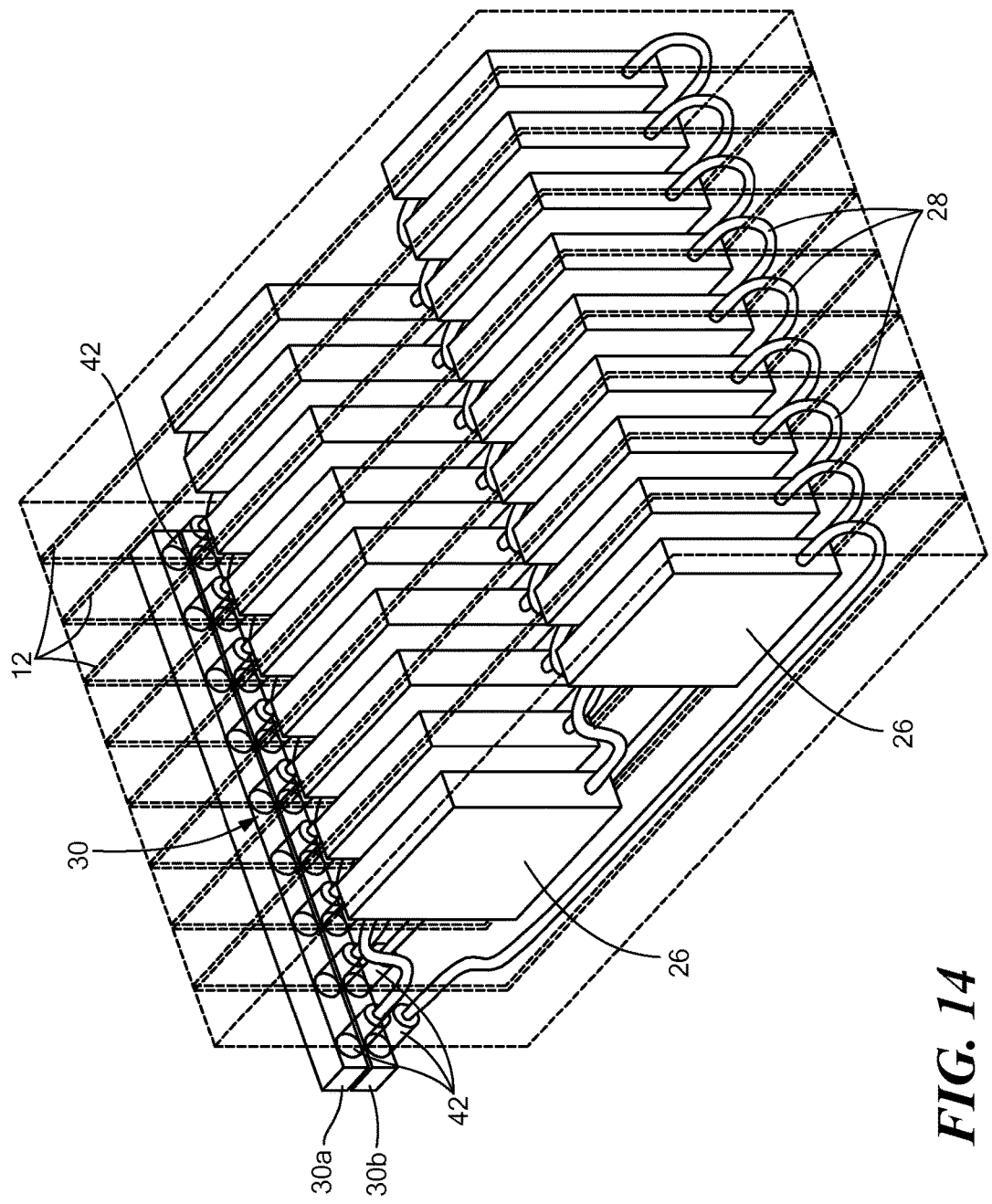
FIG. 14 schematically shows an arrangement of cold sink plates within blades and their attachment to a fluid cooling manifold in accordance with an embodiment of the present invention.

Whether using one or more cooling plates 26, the cooling plate(s) 26 for each computing blade 12 are connected to the fluid cooling manifold 38 via fluid connectors 42 (shown in phantom in FIG. 14). The fluid connectors 42 are attached to the end of the fluid connections 28, e.g., the end of a flexible hose. This configuration allows the cooling fluid from the cooling manifold 38 to flow through each of the fluid connections 28 for each of the computing blades 12 (and thus through each set of cooling plates 26 within the given computing blades 12) substantially in parallel with one another.

In operation, cooling liquid flows through fluid connections 40 to the supply line 38a in the cooling manifolds 38 in the blade enclosures 32 and then through the supply line 28a of the fluid connections 28 that connects each individual blade 12 to the cooling manifolds 38. The cooling liquid then flows through the return line 28b to a return line 38b in the cooling manifold 38 and the warmed cooling liquid is returned via the fluid connections 40. The fluid connections 40 may be connected to a broad range of facilities supplied cooling water via supply lines 40a and return lines 40b, with or without an additional external chiller unit connected to the fluid connections 40. In situations where additional cooling is needed, a liquid-to-water heat exchanger may be connected to the fluid connections 40, as discussed further in the section entitled "Cooling Distribution Unit with On-Blade Cooling" below.

Cooling Distribution Unit with On-Blade Cooling

Figure 15:
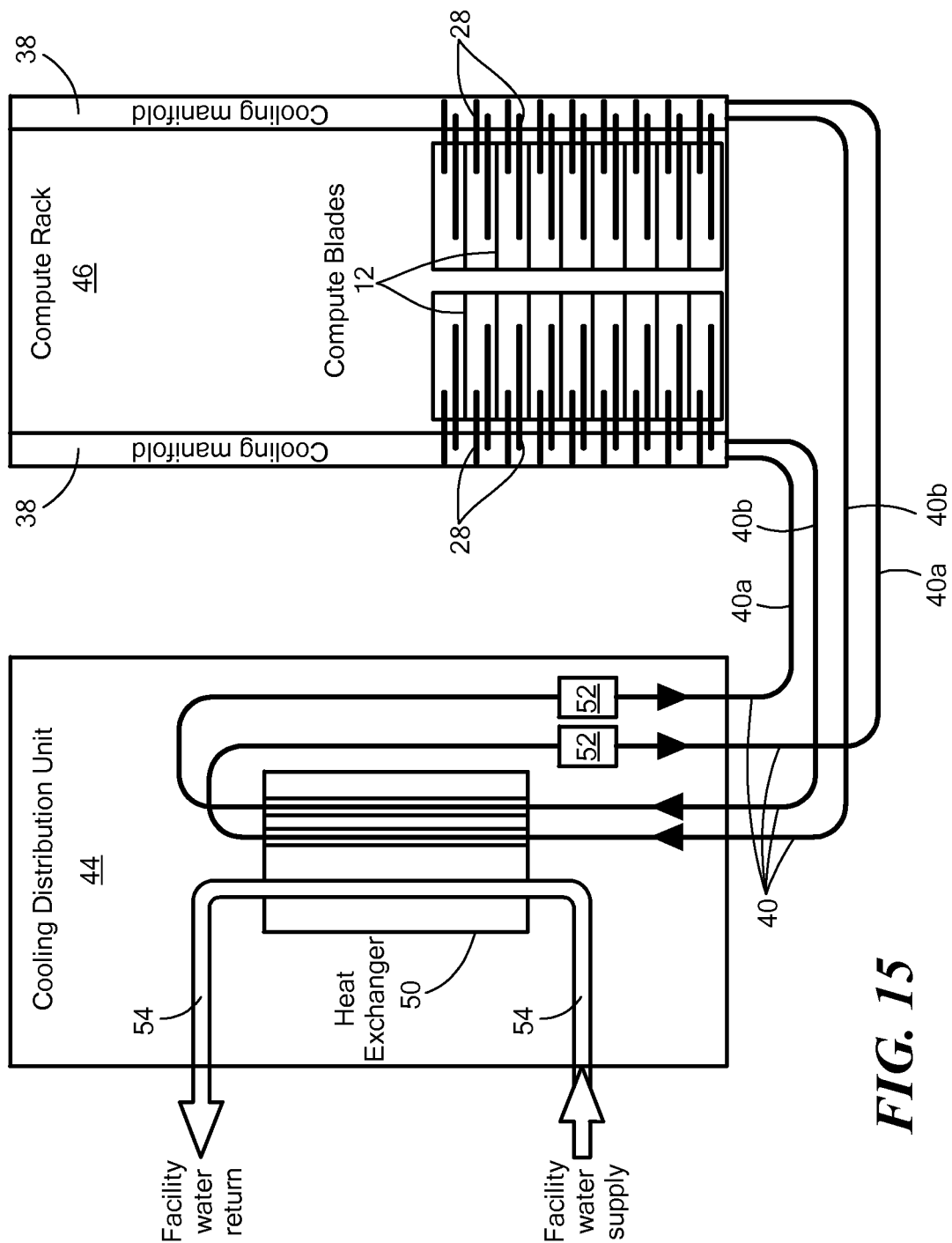
FIG. 15 schematically shows the water flow between one compute rack and an external cooling distribution unit (CDU) in accordance with an embodiment of the present invention.

As shown in FIG. 15, the on-blade cold sink system may be used with an external cooling system, such as a cooling distribution unit (CDU) 44 that is external to a compute rack 46 that holds the blade enclosure(s) 32 in order to support an increased cooling requirement for certain types of compute blades, e.g., the 720 W Gemini Twin compute blade sold by Silicon Graphics International Corp. of Fremont, Calif. For example, when the amount of heat generated by the compute blade 12 exceeds about 600 watts, a CDU 44 may be used in conjunction with the on-blade cooling system described above. The CDU 44 may be connected to the one or more blade enclosures 32, such as shown in FIG. 15, via a set of fluid connections 40, e.g., hoses, one having a supply line 40a and one having a return line 40b.

Figure 16:
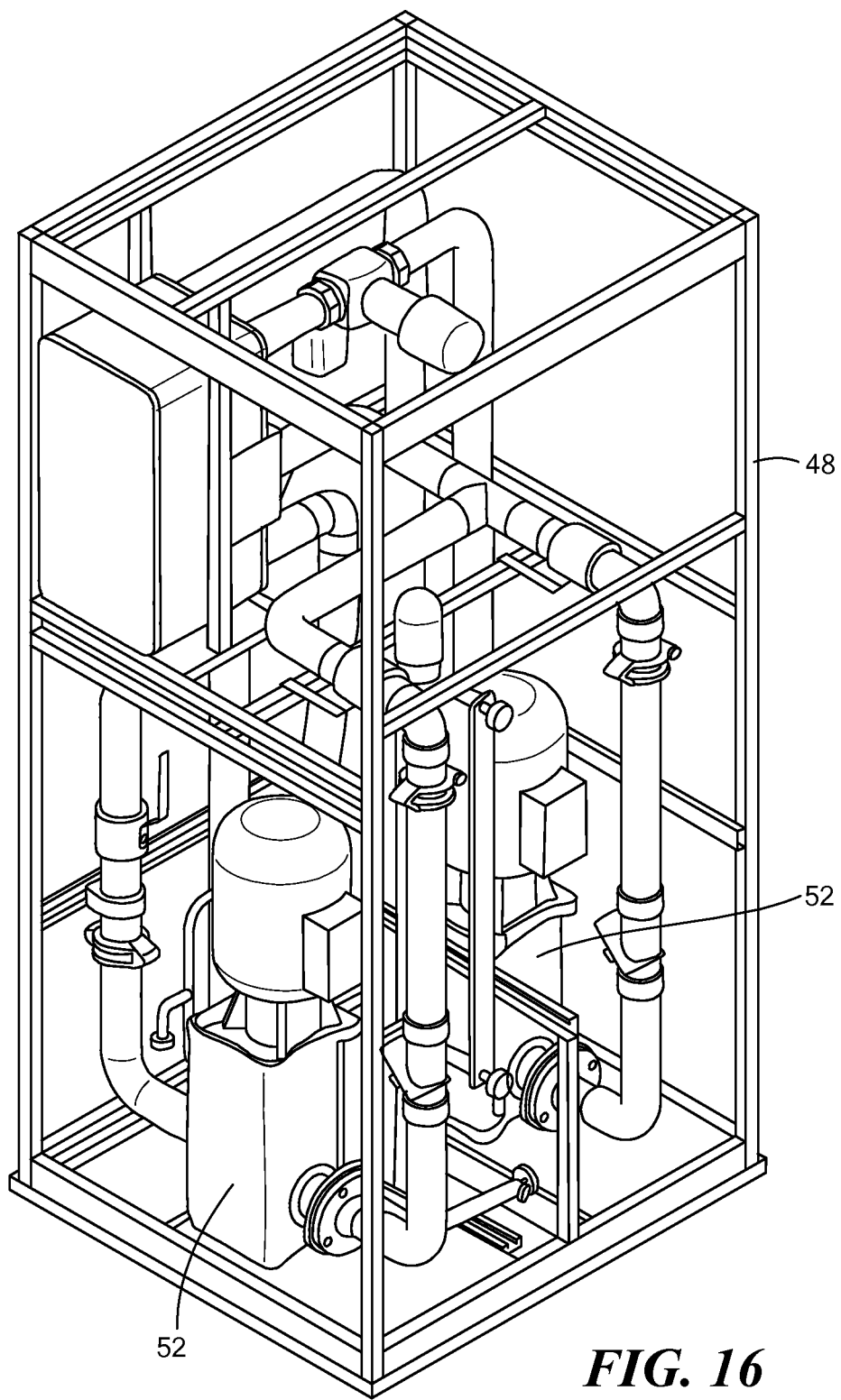
FIG. 16 schematically shows an external cooling distribution unit (CDU), with portions of the housing removed, for use with embodiments of the present invention.

Referring also to FIG. 16, the CDU 44 includes a housing 48 that encloses a heat exchanger 50 and one or more circulating pump(s) 52 along with other controls, valves and piping. FIG. 15 shows the coolant path from the CDU 44 to a set of cooling manifolds 38 located at the sides of the blade enclosures 32. In operation, the one or more circulating pumps 52 are configured to move cooling liquid within the supply line 40a of the fluid connections 40 to the cooling manifolds 38 and then through the fluid connections 28 that connect each individual blade 12 to the cooling manifolds 38. After the cooling liquid flows through the passages 34 in the cooling plate 26 and removes the heat generated by the processors 22 in the blade 12, then the cooling liquid flows to a return line in the cooling manifold 38 and the warmed cooling liquid is returned to the CDU 44 via the return line 40b of the fluid connections 40. The CDU 44 removes the heat from the cooling liquid via the heat exchanger 50, which is cooled with facility supplied cooling water via fluid connections 54, and then the CDU 44 pumps the cooled cooling liquid back to the cooling manifolds 38.

The coolant path from the CDU 44 to the cooling manifolds 38 is a closed-loop system, which helps minimize the amount of liquid lost if a leak occurs in the fluid connections 28 or 40. For example, the closed-loop system may hold approximately 55 gallons of distilled water with a water treatment solution, e.g., approximately one liter. Suitable water treatment solutions that may be used include sodium hydroxide solutions, such as those commercial available from Chemtreat, Inc. of Richmond, Va.

The CDU 44 is an interface between the building chilled water system and the cooling manifolds 38 within the compute rack 46 and is designed to circulate and control the chilled water to the cooling manifolds 38. To this end, the CDU 44 may monitor room conditions and prevent coil condensation by maintaining the chilled water being pumped to the cooling manifolds 38 at a temperature above the room's dew point. All functions within the CDU 44 may be automated, such as switching pumps (if applicable), controlling water temperature, etc. The CDU 44 is connected by fluid connections 54 to the building supply and return piping, and also connected to the cooling manifolds 38 by fluid connections 40.

Closed-loop Cooling Cell Configuration with CDU

Figure 17:
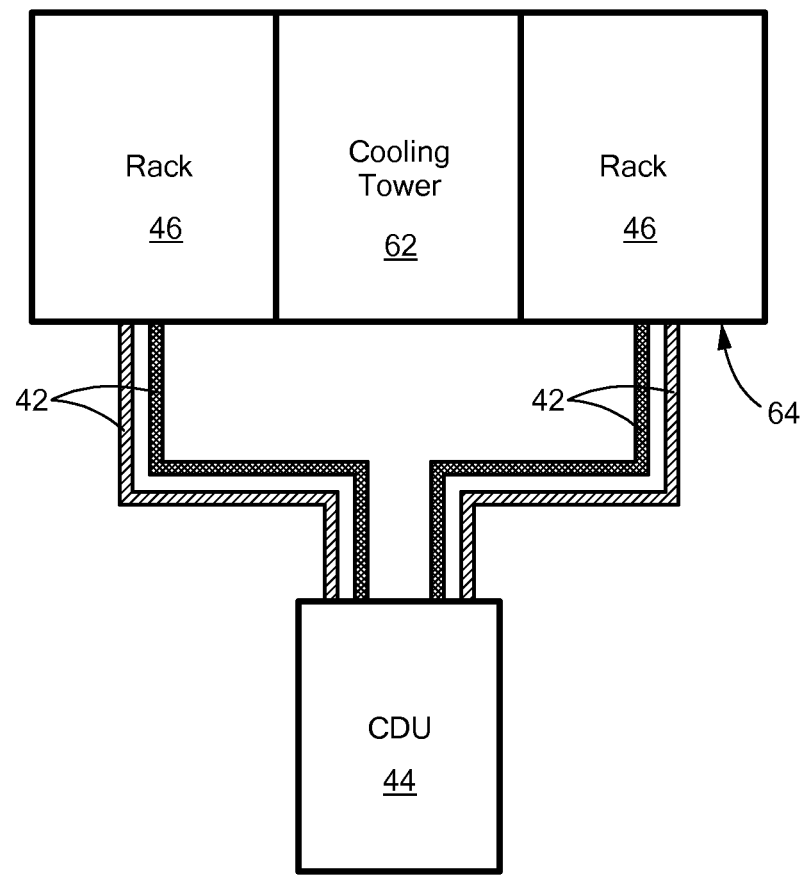
FIG. 17 schematically shows a closed-loop cooling cell configuration with an external cooling distribution unit (CDU) in accordance with an embodiment of the present invention.

The on-blade cold sink system may also be used with a closed-loop cooling cell configuration that includes two compute racks 46 and a cooling tower 62 between the compute racks 46, as shown in FIG. 17. Each compute rack 46 includes at least one blade enclosure 32 having the cooling manifolds 38 and on-blade cooling system as discussed above. For example, the cooling tower 62 may be used with M-Rack and wide-rack configurations that include cooling manifolds 38.

The cooling tower 62 includes one or more water-cooled heat exchangers and one or more blowers configured to draw warm air from the side of the compute racks towards the back, across the water-cooled heat exchanger, and to circulate cooled air to the side of the compute racks towards the front. The closed-loop cooling cell configuration further includes a housing 64 enclosing the compute racks 46 and the cooling tower 62 to provide a closed-loop air flow within the housing 64. Further details of the closed-loop cooling cell configuration can be found in the application entitled CLOSED-LOOP COOLING SYSTEM FOR HIGH-DENSITY CLUSTERED COMPUTER SYSTEM, which is incorporated by reference herein in its entirety.

Although the above discussion discloses various exemplary embodiments of the invention, it should be apparent that those skilled in the art can make various modifications that will achieve some of the advantages of the invention without departing from the true scope of the invention.

What is claimed is:

1. A high performance computing (HPC) system having a plurality of computing blades, at least one computing blade comprising:
    two computing boards; and
    two side rails disposed at either side of the computing boards, each side rail having a board alignment element configured to hold the two computing boards within the computing blade; wherein the board alignment element includes a substantially c-shaped portion with upper and lower board attachment portions substantially perpendicular to the side rails and also includes mounting sections that extend beyond an outer side of each of the board attachment portions respectively, wherein the mounting sections are configured to couple the board alignment element to the side rail in a snap-fit configuration, and wherein each computing board is adjacent to the outer side of the upper or lower board attachment portions.

2. The HPC system of claim 1, wherein each computing board has a top surface and a bottom surface, each computing board has a plurality of components mounted to its top surface according to a common layout, and the two computing boards are held within the computing blade such that the plurality of components mounted to the top surface of one computing board are interleaved between the plurality of corresponding components mounted to the top surface of the other computing board.

3. The HPC system of claim 1, wherein the computing blade includes two computing boards configured as two separate computing nodes.

4. The HPC system of claim 1, wherein the two computing boards are disposed on top of one another such that the top of one computing board faces the top of the other computing board.

5. The HPC system of claim 4, wherein the computing blade further includes:
    one or more air-cooled heat sinks, each heat sink disposed between the two computing boards.

6. The HPC system of claim 1, further comprising one or more blade enclosures configured to hold the plurality of computing blades.

7. The HPC system of claim 6, wherein the computing blade includes two computing boards and the blade enclosure includes a fluid cooling manifold, wherein the system further comprises:
    one or more cooling plates, each cooling plate disposed between the two computing boards; and
    a fluid connection coupled to the cooling plate and in fluid communication with the fluid cooling manifold.

8. The HPC system of claim 7, wherein the cooling manifold is along a back of the blade enclosure and configured to connect to each cooling plate between the two computing boards.

9. The HPC system of claim 7, wherein the cooling manifold is along a side of the blade enclosure and configured to connect to each cooling plate between the two computing boards.

10. The HPC system of claim 7, wherein two cooling plates are disposed between the two computing boards in a side-by-side configuration, one plate between the two computing boards in one region of the computing blade and the other plate between the two computing boards in another region of the computing blade.

11. The HPC system of claim 7, wherein four cooling plates are disposed between the two computing boards, two plates between the two computing boards in one region of the computing blade and the other two plates between the two computing boards in another region of the computing blade.

12. The HPC system of claim 7, wherein the cooling manifold includes a supply line and a return line.

13. The HPC system of claim 7, further comprising an external cooling distribution unit having fluid connections in fluid communication with the cooling manifold.

14. The HPC system of claim 13, wherein the external cooling distribution unit further includes
    a liquid-cooled heat exchanger in contact with a portion of the fluid connections; and
    one or more pumps configured to move liquid within the fluid connections from the cooling manifolds to the liquid-cooled heat exchanger.

15. The HPC system of claim 14, wherein the blade enclosures are configured in two compute racks, and the system further includes:
    a cooling tower adjacent to a side of the first compute rack and a side of the second compute rack, the cooling tower having at least one water-cooled heat exchanger, and one or more blowers configured to draw warm air from the side towards a back of the first and second compute racks across the water-cooled heat exchanger, and to circulate cooled air to the side towards a front of the first and second compute racks; and
    a housing enclosing the first compute rack, the second compute rack, and the cooling tower to provide a closed-loop air flow within the housing.

16. The HPC system of claim 1, further comprising one or more blade enclosures configured to hold the plurality of computing blades, wherein the blade enclosures are configured in two compute racks, and the system further includes:
    a cooling tower adjacent to a side of the first compute rack and a side of the second compute rack, the cooling tower having at least one water-cooled heat exchanger, and one or more blowers configured to draw warm air from the side towards a back of the first and second compute racks across the water-cooled heat exchanger, and to circulate cooled air to the side towards a front of the first and second compute racks; and a housing enclosing the first compute rack, the second compute rack, and the cooling tower to provide a closed-loop air flow within the housing.

17. The HPC system of claim 2, wherein the plurality of components mounted to the top surface of each of the two computing boards includes a plurality of dual in-line memory modules (DIMMs), and wherein the board alignment element is configured to hold the two computing boards within the computing blade so that a plurality of the DIMMs mounted to the top surface of one computing board are interleaved between a plurality of corresponding DIMMs mounted to the top surface of the other computing board.

18. A computing blade for a high performance computing (HPC) system, the computing blade comprising:
two side rails disposed at opposing sides of the computing blade, each side rail having a board alignment element configured to hold two computing boards within the computing blade; wherein the board alignment element includes a substantially c-shaped portion with upper and lower board attachment portions substantially perpendicular to the side rails and also includes mounting sections that extend beyond an outer side of each of the board attachment portions respectively, wherein the mounting sections are configured to couple the board alignment element to the side rail in a snap-fit configuration, and wherein the board alignment element is configured to hold the computing boards adjacent to the outer sides of the upper and lower board attachment portions.

* * * * *